(12) United States Patent
Tarng

(10) Patent No.: US 7,511,589 B2
(45) Date of Patent: Mar. 31, 2009

(54) DFY OF XTALCLKCHIP: DESIGN FOR YIELD OF TRIMMING-FREE CRYSTAL-FREE PRECISION REFERENCE CLOCK OSILLATOR IC CHIP

(75) Inventor: Min Ming Tarng, San Jose, CA (US)

(73) Assignee: Tang System, San Jose, CA (US)

( * ) Notice: Subject to any disclaimer, the term of this patent is extended or adjusted under 35 U.S.C. 154(b) by 59 days.

(21) Appl. No.: 11/593,271

(22) Filed: Nov. 6, 2006

(65) Prior Publication Data
US 2008/0042766 A1   Feb. 21, 2008

Related U.S. Application Data

(63) Continuation-in-part of application No. 11/500,125, filed on Aug. 5, 2006.

(51) Int. Cl.
| | |
|---|---|
| H03B 5/04 | (2006.01) |
| H03B 5/08 | (2006.01) |
| H03B 5/12 | (2006.01) |
| H03B 5/18 | (2006.01) |
| H03B 5/30 | (2006.01) |

(52) U.S. Cl. .......... 331/117 R; 331/117 FE; 331/117 D; 331/176; 331/177 V

(58) Field of Classification Search ............ 331/34, 331/36 C, 66, 69, 70, 96, 117 R, 117 FE, 331/117 D, 175, 176, 177 R, 177 V
See application file for complete search history.

(56) References Cited

U.S. PATENT DOCUMENTS 7,307,486 B2 *  12/2007  Pernia et al. ............. 331/173

* cited by examiner

*Primary Examiner*—David Mis

(57) ABSTRACT

A Design For Yield (DFY) of Crystal Chip (XTALCHIP (Trademark for a chip equivalent to a crystal resonator)) is to have the high yield of high quality high accurate clock chip to be able to integrated in the SOC environment to save the production cost and board space, etc. The LC oscillation (LCO) tank has the constant oscillation amplitude control, constant oscillation common mode voltage, and inductor parametric resistance compensation over temperature and oscillation glitch filter capacitors.

20 Claims, 40 Drawing Sheets

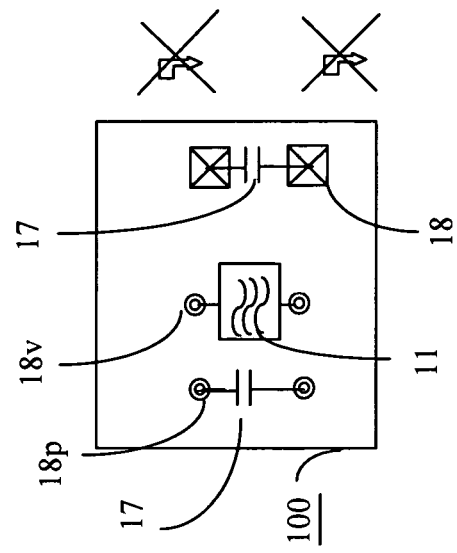
FIG.3C
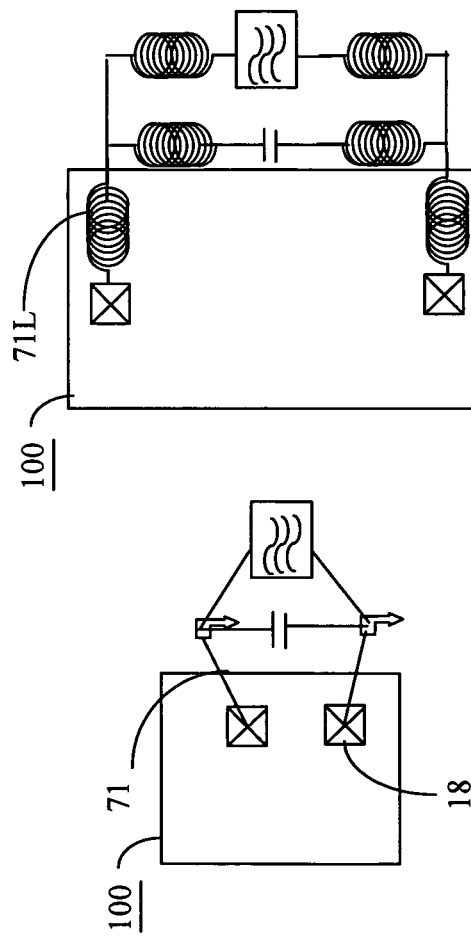
FIG.3B (Prior Art)
FIG.3A (Prior Art)
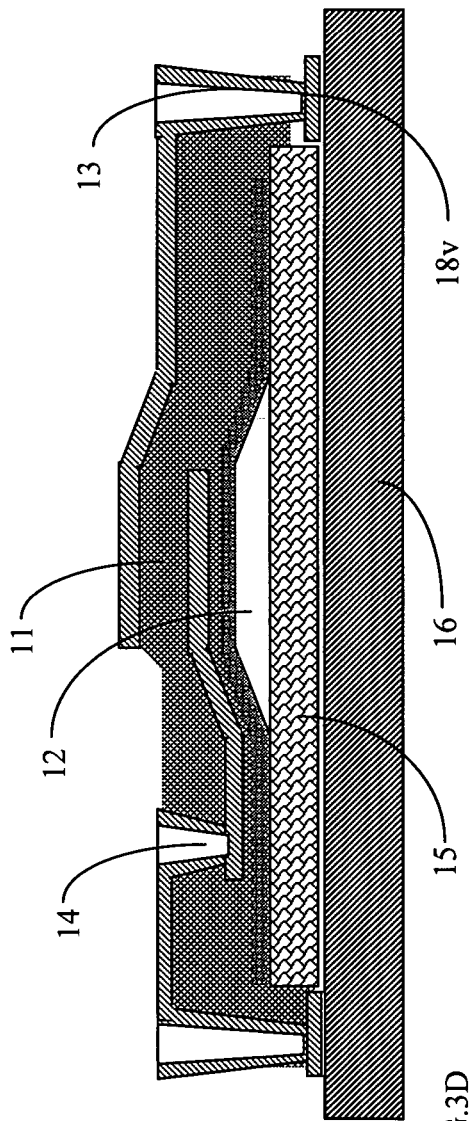
FIG.3D

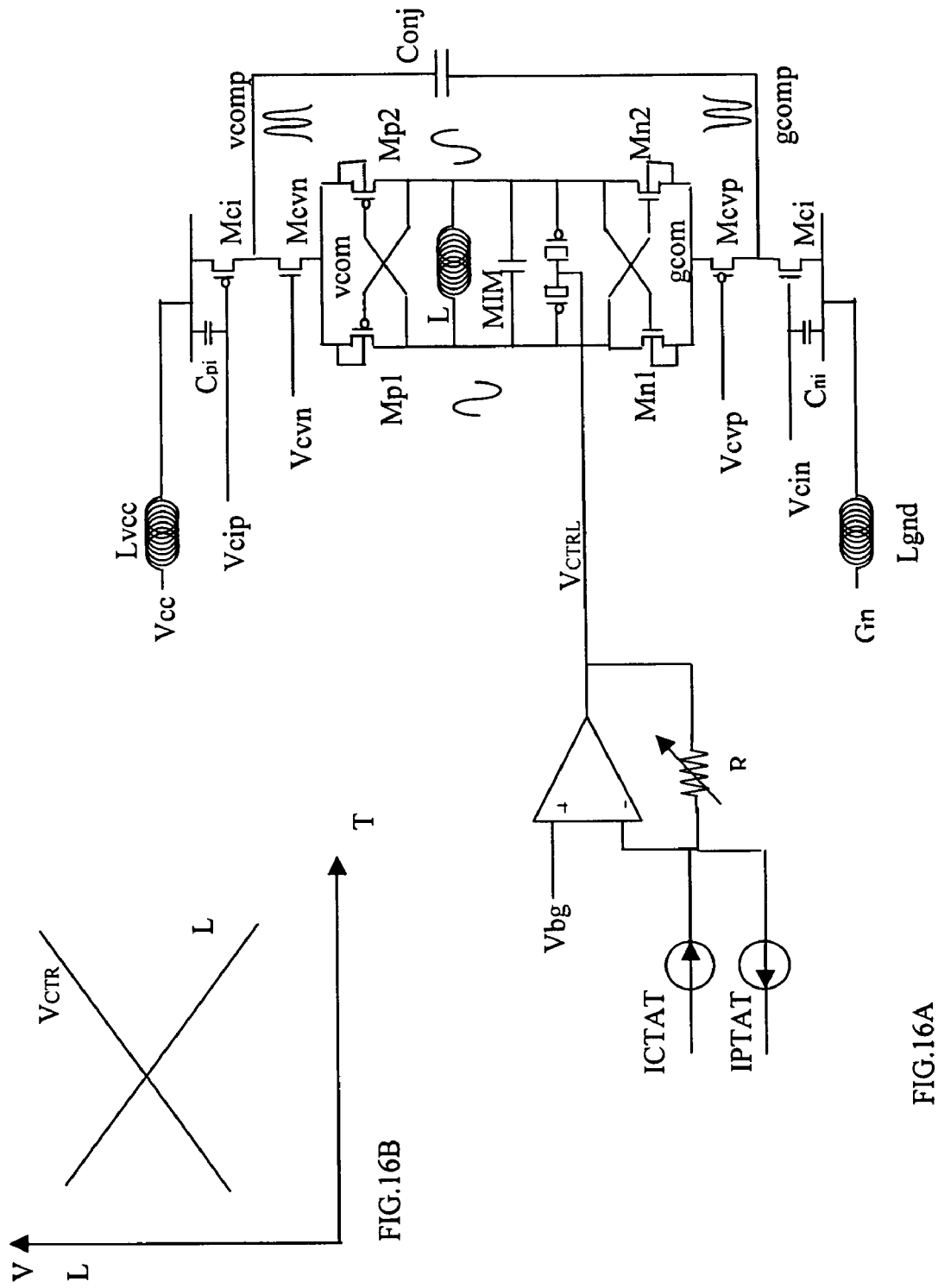

DFY OF XTALCLKCHIP: DESIGN FOR YIELD OF TRIMMING-FREE CRYSTAL-FREE PRECISION REFERENCE CLOCK OSILLATOR IC CHIP

This is a Continuation in Part application claims priority of U.S. patent application Ser. No. 11/500,125, filed Aug. 5, 2006, which herein incorporated by reference in its entirety.

BACKGROUND

1. Field of Invention

Design For Yield (DFY) is design to increase the yield in the real production chip. In the real chip, it is very complicated system. On the chip, there is a lot of noise. The circuit is not only designed for the silent solid power and ground but also has to work in the dynamic noisy environment.

Before, we have a large board, small chips and low ramping signal in the slow signal process. We can assume solid power and ground on the board and all the noise is dumped onto the board. Now, we have a tiny board, the giant SOC chips and the fast rising and falling signal in the signal process. We can no more assume the solid power and ground on the board and have all the noise been dumped onto the board. The chip and board are very noisy. However, today's analog front end (AFE) design is sill based on the "implicit assumptions" of the old-time design style. The AFE have very poor performance in such a noisy environment. The traditional AFE design is the army style circuit design. The earth is solid and not moving. Today analog circuit on SOC chip is the navy style circuit. The sea oscillates and vibrates violently. So, all the AFE sub-modules work individually. However, as they are put together on the SOC chip, the analog circuit does not work properly. The board is very noisy. All the digital noise is leaked to the tiny board.

The original definition of mixed signal simulation=analog (SPICE)+digital (Verilog). However, the mixed signal analog circuit has to survive in the noisy SOC environment. So, based on the SOC design discipline, the design for yield (DFY) has the analog/mixed signal/RF unified platform. The design methodology is developed to be unified design platform for the analog/mixed signal/RF design. Based on the whole chip/board simulator, the test bench for AFE has been developed successfully. The XTALCHIP (Trademark for a chip equivalent to a crystal resonator) is the chip having the most challenging requirements of all the chips. Based on DFY design and the whole chip/board simulator, the test bench for XTALCHIP (Trademark for a chip equivalent to a crystal resonator) has been developed successfully.

Both the XTALCHIP (Trademark for a chip equivalent to a crystal resonator) and XTALCLKCHIP (Trademark for a chip equivalent to a clock chip and including means equivalent to a crystal resonator) are the trademarks of Tang System. The XTALCLKCHIP (Trademark for a chip equivalent to a clock chip and including means equivalent to a crystal resonator) is the dream to replace the Crystal on the board and clock circuits in the chip with the XTALCHIP (Trademark for a chip equivalent to a crystal resonator). Furthermore, the XTALCHIP (Trademark for a chip equivalent to a crystal resonator) can be integrated with the chip to be SOC(System On Chip). The XTALCHIP (Trademark for a chip equivalent to a crystal resonator) integrated with the clock system which comprising PLL, etc to be the XTALCLKCHIP (Trademark for a chip equivalent to a clock chip and including means equivalent to a crystal resonator). However, from the system view, the XTALCHIP (Trademark for a chip equivalent to a crystal resonator) and XTALCLKCHIP (Trademark for a chip equivalent to a clock chip and including means equivalent to a crystal resonator) have the common resources which can be shared with each other. If the XTALCLKCHIP (Trademark for a chip equivalent to a clock chip and including means equivalent to a crystal resonator) has the direct access to the interior structure of the XTALCHIP (Trademark for a chip equivalent to a crystal resonator), then the system integration will be much more realistic.

With the combination of the monolithic above-IC resonator bulk acoustic wave BAW VCO and fractional-N frequency synthesizer with randomized multiphase VCO, we have the XTALCLKCHIP (Trademark for a chip equivalent to a clock chip and including means equivalent to a crystal resonator). The XTALCLKCHIP (Trademark for a chip equivalent to a clock chip and including means equivalent to a crystal resonator) is Trimming-Free Crystal-Free Precision Reference Clock Oscillator IC chip.

Unlike the RF LC clock generator in the prior arts, the XTALCLKCHIP (Trademark for a chip equivalent to a clock chip and including means equivalent to a crystal resonator) doesn't need to trim the bandgap voltage, flat current, capacitor in the LC tank, etc. The bandgap voltage and current vary nonlinear; capacitor varies nonlinear; inductor varies nonlinear. So many nonlinear factors work and combine together, it is impossible to use the trimming to have the compensation to be constant clock frequency.

The XTALCLKCHIP (Trademark for a chip equivalent to a clock chip and including means equivalent to a crystal resonator) will generate the customer's clocks directly. So, it might consider the XTALCLKCHIP (Trademark for a chip equivalent to a clock chip and including means equivalent to a crystal resonator) without the dividers to divide the LC tank down. Instead of dividing the LC tank down, the LC tank directly converts to the customer's clocks. From the system view point, our system saves the dividing process and eliminates the noise in the dividing process. Furthermore, the customer saves the PLL. The XTALCLKCHIP (Trademark for a chip equivalent to a clock chip and including means equivalent to a crystal resonator) is to get rid of the Crystal, crystal clock circuit and the PLL circuit with the high frequency direct conversion to other frequencies without the dividing the high frequency oscillation to low frequency clock.

2. Description of Prior Art

Recently, there are some industrial activities which are what we said XTALCHIP (Trademark for a chip equivalent to a crystal resonator). They used the LC tank to generate the 1 GHz oscillation first. Then divided the 1 GHz oscillation 40 times with a series of divide-by-2 dividers. Their argument is that the phase noises will be less in the dividing process. However, this argument is not true. It violates the communication theory. In fact, the phase noise does accumulate in the dividing process. The fact is that they have to use the synchronize circuit to re-sample the divided clock 24 MHz with the 1 GHz oscillation to reduce the phase noise in the divided clock 24 MHz. Since the re-sample of the fclk with the $f_o$ oscillation of the LC tank signal, the output clock fclk must be the integer number of the $f_o$ of the LC tank. They cannot generate the customer's specified clock frequency.

Furthermore, to keep the output clock to be constant over the variation of the temperature, voltage, process and aging, they have a lot of trimming resistors, capacitors, etc in the bandgap voltage reference, current reference, LCO oscillator, etc. To calibrate the chip and have the correct trimming values to store in the on-chip NVM (Non Volatile Memory), it costs a lot of resources in the calibration and test.

They don't use the PLL circuit. Their argument is the PLL introducing a lot of phase noise to the clock. So, they don't have the capability to adjust the final clock frequency. As the LC tank does not oscillate at the specified $f_o$, they cannot adjust the final output clock at all. Especially, they used the on-chip inductors. The L and C values of the on-chip LC tank are extremely difficult to control. It is easily out of 20% deviation from the original designed oscillation. It is impossible for them to tune the offset resonant frequency back to the original designed output clock frequency range.

Since they don't use PLL, they cannot have the fractional –N capability to meet the different output clock frequency requirement. Even if their chip can have the constant frequency $f_o$, however, they still cannot have the different output frequency fclk for different customers.

Furthermore, the FCC requires the spread spectrum of the output clock. Since in their design, the only frequency tuner is at their LC tank to change the spread spectrum. Now, the 10 KHz variance of the 1 GHz LC tank signal, 1 G/10K=100000=17 bits accuracy. It has to use the varactor capacitance to vary with 17 bits accuracy. However, for the passive component accuracy limit is about 14 bits accuracy. So, it is impossible for the prior art which modulates the LC tank frequency to have the spread spectrum capability.

The RF LC clock generator in prior art adopts the trimming method to trim the bandgap voltage, flat current, capacitor in the LC tank, etc. However, the bandgap voltage and current vary nonlinear; capacitor varies nonlinear; inductor varies nonlinear. So many nonlinear factors work and combine together, it is impossible to use the trimming to have the compensation to be constant clock frequency.

The prior art cannot generate the custom's clock directly. The prior has to divide the oscillation LC tank down to low frequency, then the customer has to boost up the frequency to high frequency with PLL. So, even the prior art claims that they don't have the PLL, however, they push the headache and burden to the user and customer's side. For the whole system, it still has PLLs. However, the customer has to take the responsibility to develop their own PLLs to boost up the frequency to the high frequencies.

So, the prior art hides a lot true facts from the customer. It is not a practical approach at all.

OBJECTS AND ADVANTAGES

The DFY XTALCLKCHIP (Trademark for a chip equivalent to a clock chip and including means equivalent to a crystal resonator) is the trimming-free crystal-free precision reference clock oscillator IC chip. Without any trimming, the XTALCLKCHIP (Trademark for a chip equivalent to a clock chip and including means equivalent to a crystal resonator) can provide the customer-specific reference clock and application-specific clocks to the customer. It saves the customer's crystal, crystal circuit and PLLs circuit.

From low end to high end DFY XTALCLKCHIP (Trademark for a chip equivalent to a clock chip and including means equivalent to a crystal resonator)s, the inductor can be bonding wire, on-chip inductors, gyrator and BAW, etc.

In the DFY XTALCLKCHIP (Trademark for a chip equivalent to a clock chip and including means equivalent to a crystal resonator) design, the most advanced DFY circuit design methodology of the hierarchical circuit design is applied to the noise design discipline of the DFY circuit design. With the distributed embedded LDVRs, all the modules of the XTALCLKCHIP (Trademark for a chip equivalent to a clock chip and including means equivalent to a crystal resonator) are isolated from each other that the LCO pulling is minimized. The external disturbance of the LCO is minimized that the LCO frequency is crystal clean.

Furthermore, the DFY XTALCLKCHIP (Trademark for a chip equivalent to a clock chip and including means equivalent to a crystal resonator) can be integrated as IP that the external crystal and pins are completely eliminated. It increases the system performance and reduces the system cost.

DRAWING FIGURES

FIG. 11 This is the analog system design of LDVR. (A) is the schematics of low noise, external-capacitor-free Low Drop Voltage Regulator (LDVR) for low frequency and high Giga Hz frequency range power supply and noise isolation; (B) is the schematics of the low noise, external-capacitor-free Low Drop Voltage Regulator (LDVR) for low frequency and Meg Hz frequency range power supply and noise isolation; (C) is the model of the idealized LDVR; (D) is the power noise and the smart sampling strategy for the switch capacitor noise filter; this is hierarchical circuit design with the digital/logic circuit embedded in the switch capacitor and analog circuit; it is not the analog circuit at all; (E) is the gain diagram of the conventional flat circuit design with the pure analog circuit of the LDVR with the external capacitor; (F) is the gain diagram of the hierarchical circuit design with the digital/logic and smart sampling switch capacitor embedded in the analog circuit of the LDVR as shown in FIG. 11A.

FIG. 12 (A) is the schematic of LC oscillator with the embedded LDVR mechanism having both current source and voltage source to have the quenching effect on the power and ground noise; (B) is the output oscillation of the conventional LCO; (C) is the logic/digital circuit can have the same embedded LDVR structure to supply the power and have the noise isolation; (D) is the simplified version of FIG. 12A having no voltage source.

FIG. 13 is the schematic of programmable LNA for the high frequency direct input of clock signal. (A) is the basic single end LNA having the programmable gain capability; (B) is the low noise differential end programmable gain LNA (PGLNA).

Figure 14:
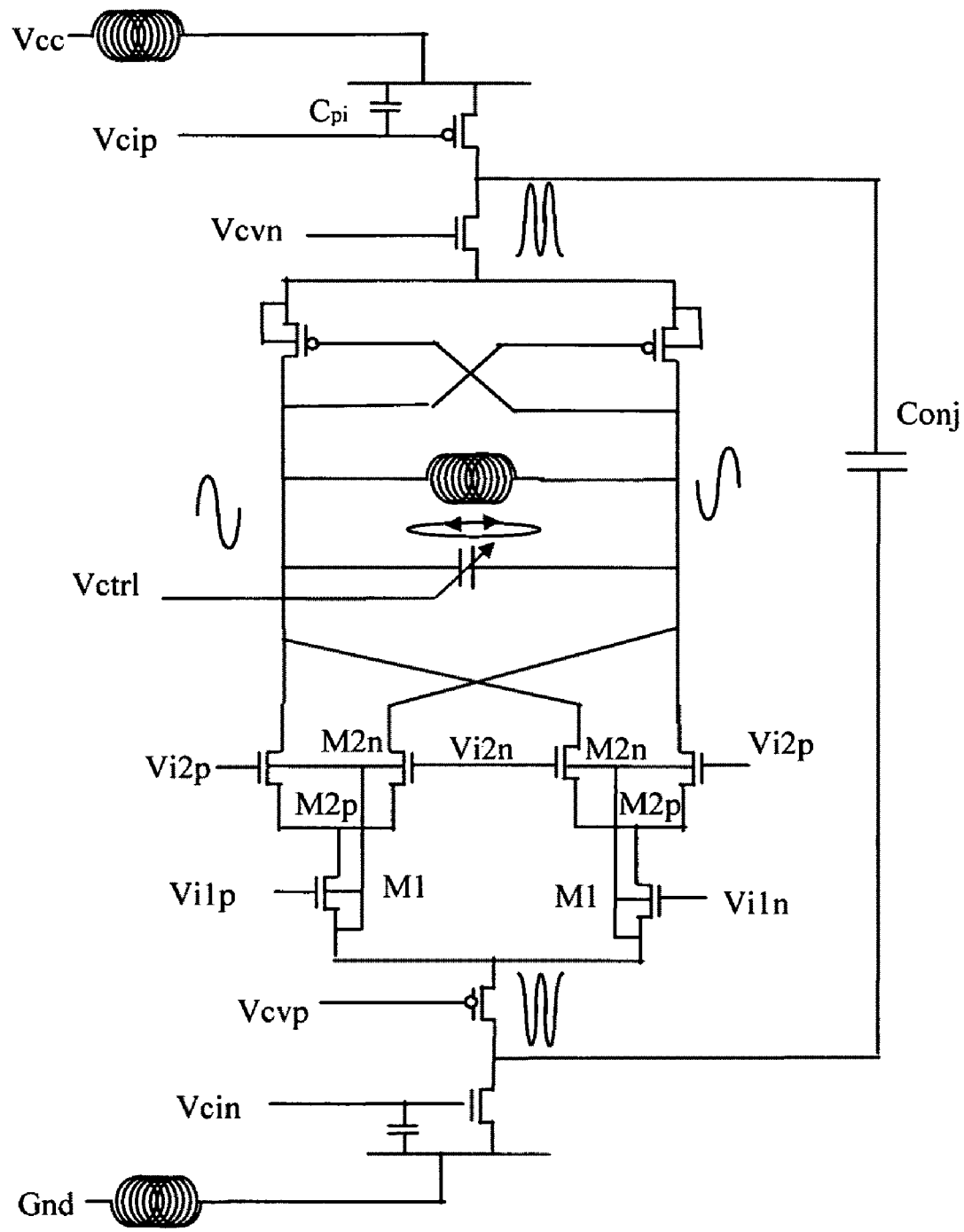

FIG. 14 is the schematic of programmable filtering mixer with the embedded LDVR mechanism having the quenching effect on the self-generated mixer noise.

Figure 15:
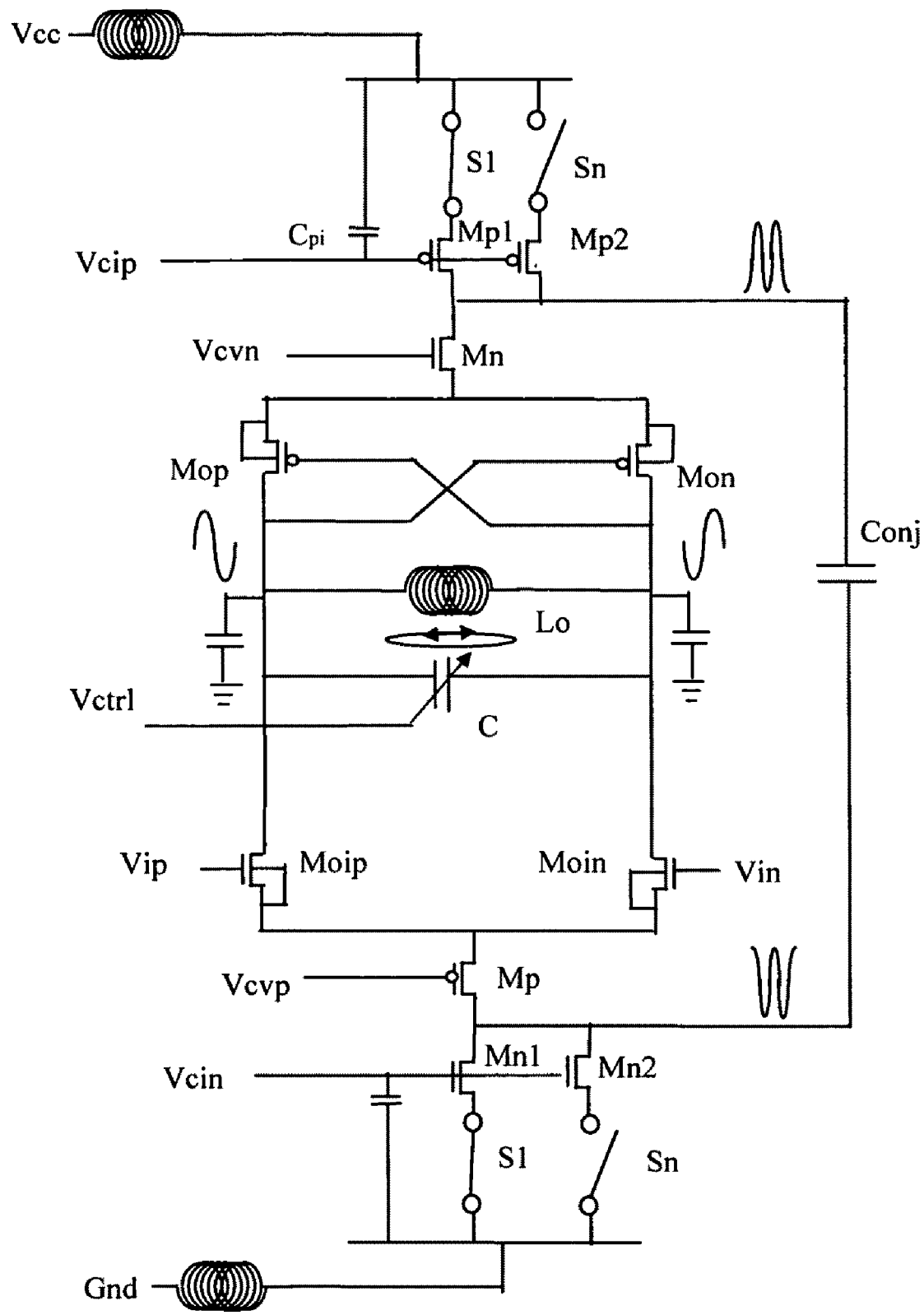

FIG. 15 is the schematic of programmable output driver of buffer with the embedded LDVR mechanism having the quenching effect on the self-generated noise.

FIG. 16 (A) is the direct analog compensation for the L over temperature variation in the LC tank without the A/D and digital control, etc.; (B) is the principle of the direct analog compensation for the L in the LC tank over temperature variation.

FIG. 17 is the Design For Yield (DFY) applied to the chip design and production flow; (A) is the design phase and debug phase which have different conditions; (B) is the DFY to unify the design phase and debug phase.

FIG. 18 is the DFY simulation methodology; (A) is the ideal analog simulation with the solid power and ground; (B) is the real chip situation; (C) is the simulation for the real chip; (D) is the DFY PSRR (Power Supply Reject Ratio) AC test; (E) is the DFY stepwise transient test.

Figure 19:
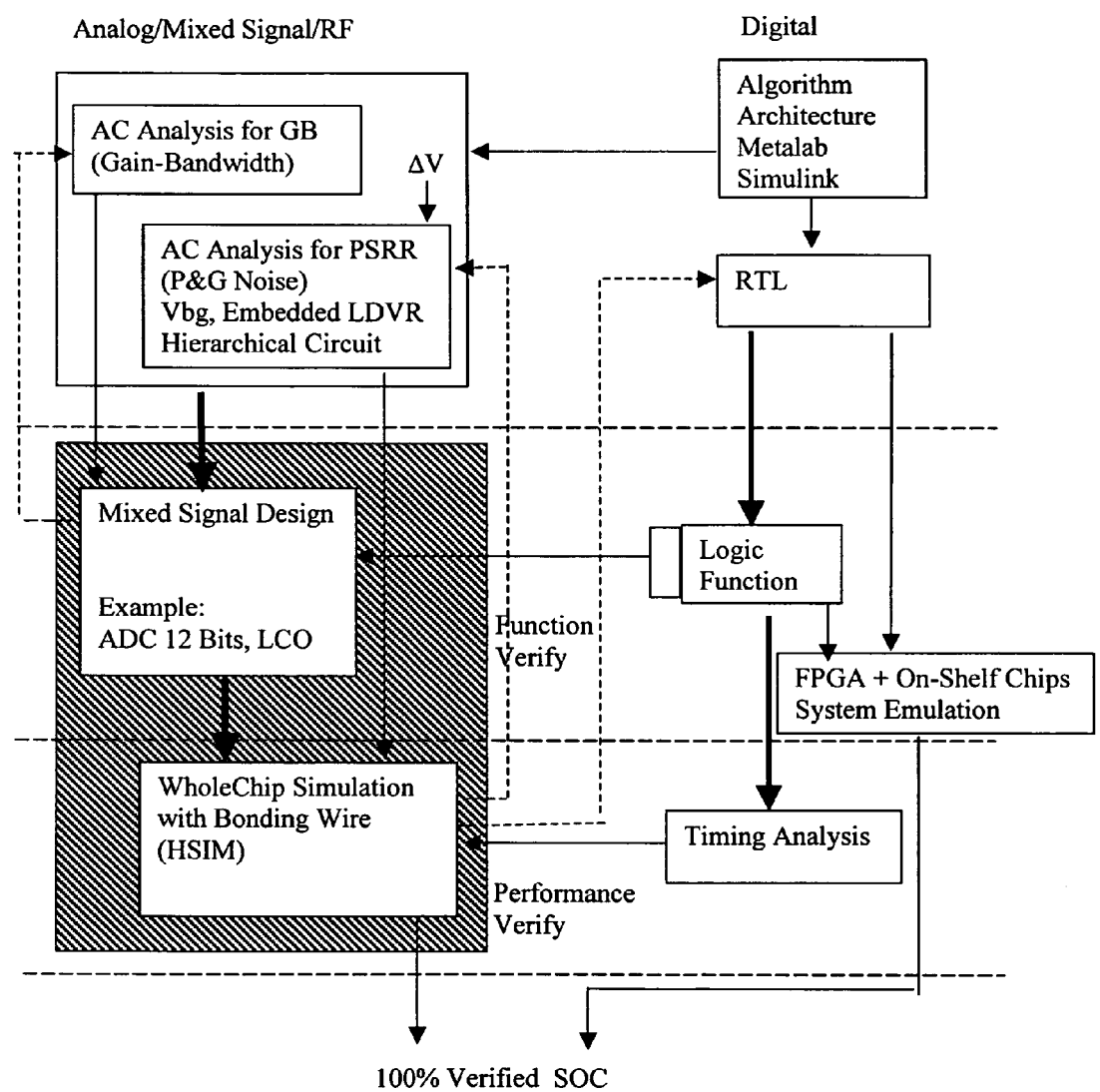

FIG. 19 is the DFY design flow for SOC (System On Chip).

FIG. 20 is the DFY chip platform; (A) is the idealized model of the DFY chip; (B) is implementation of the idealized DFY chip model; (C) is the MOS model; (D) is the DFY chip model which is conjugate to the MOS model; (E) is the system model with on-board LDVR; (F) is the system model with the on-chip model; (G) is the system model with the DFY platform.

FIG. 21 (A) is the DFY bandgap circuit design for the multiple power buses with the POS (Power-On-Sequence), POR (Power-On-Reset), offset voltage, etc problems; (B) the offset voltage of OPAMP causes the failure of the bandgap voltage circuit.

FIG. 22 is the DFY voltage reference generator; (A) is the static voltage reference; (B) is the DFY voltage reference circuit.

FIG. 23 is the DFY clock reference generator; (A) is the varactor used in the LCO tank; (B) is the dynamic clock reference for LCO tank; (C) is the DFY clock reference circuit; (D) is the common mode generator adopted in the common mode control loop adopted in FIG. 23C; (E) is the peak detector adopted in the amplitude control loop adopted in FIG. 23C; (F) is the DFY clock reference circuit with the temperature compensation capacitor for the inductor parametric resistance; (G) is the varactor characteristic curve; (H) is the natural oscillation frequency $f_o$ of the temperature compensation capacitor LCO tank as shown in FIG. 23F.

Figure 24A:
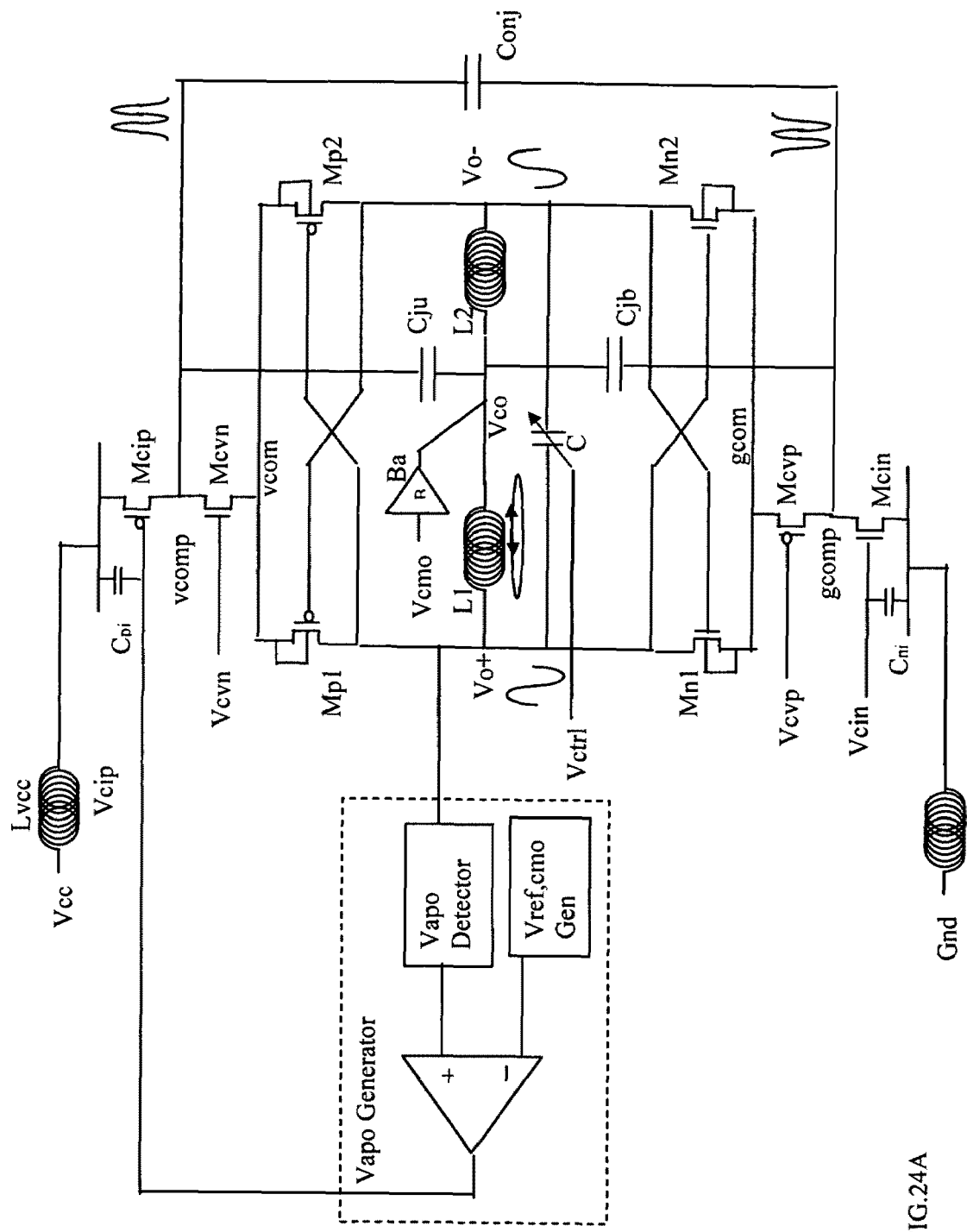
Figure 24B:
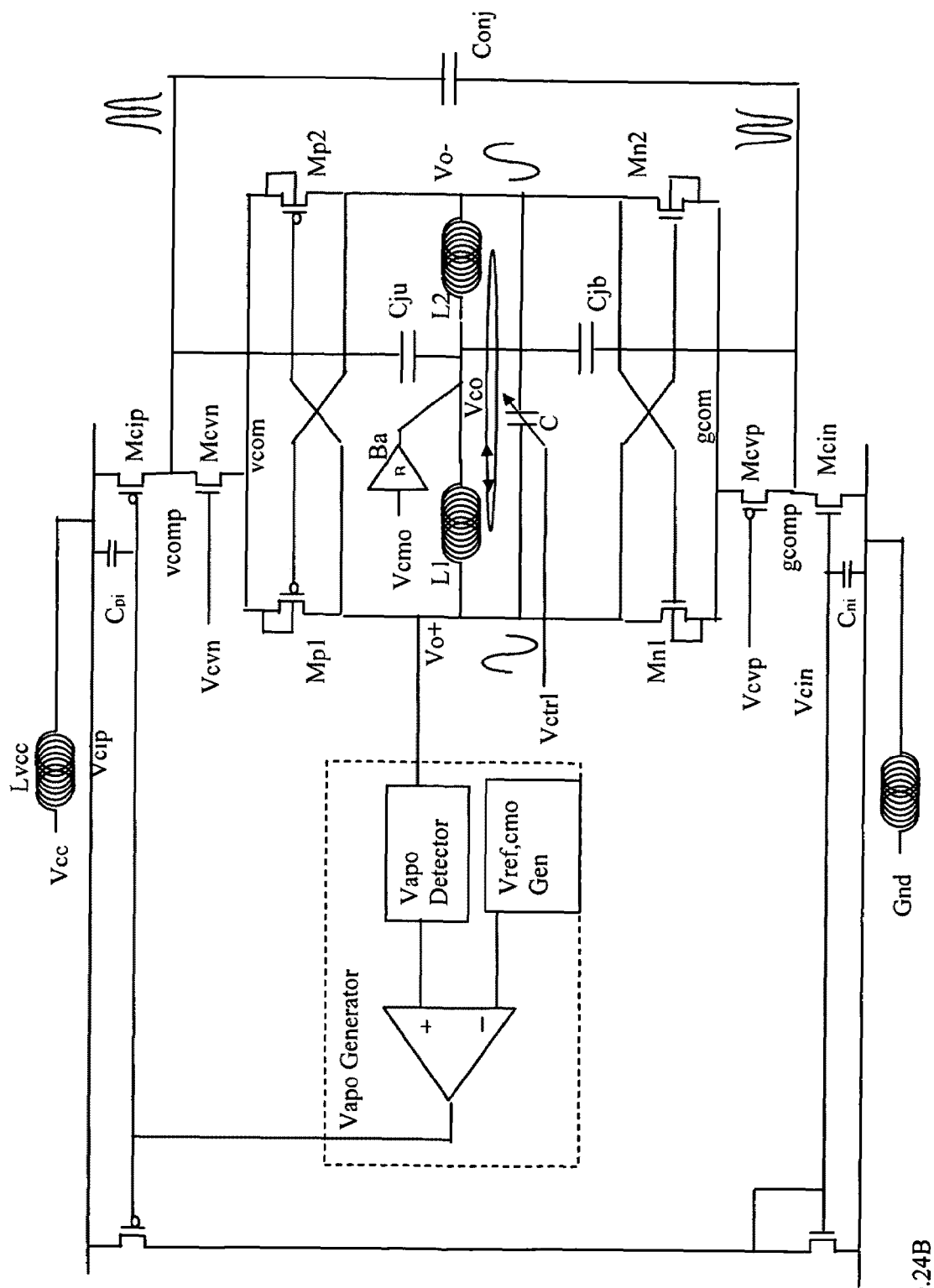
Figure 24C:
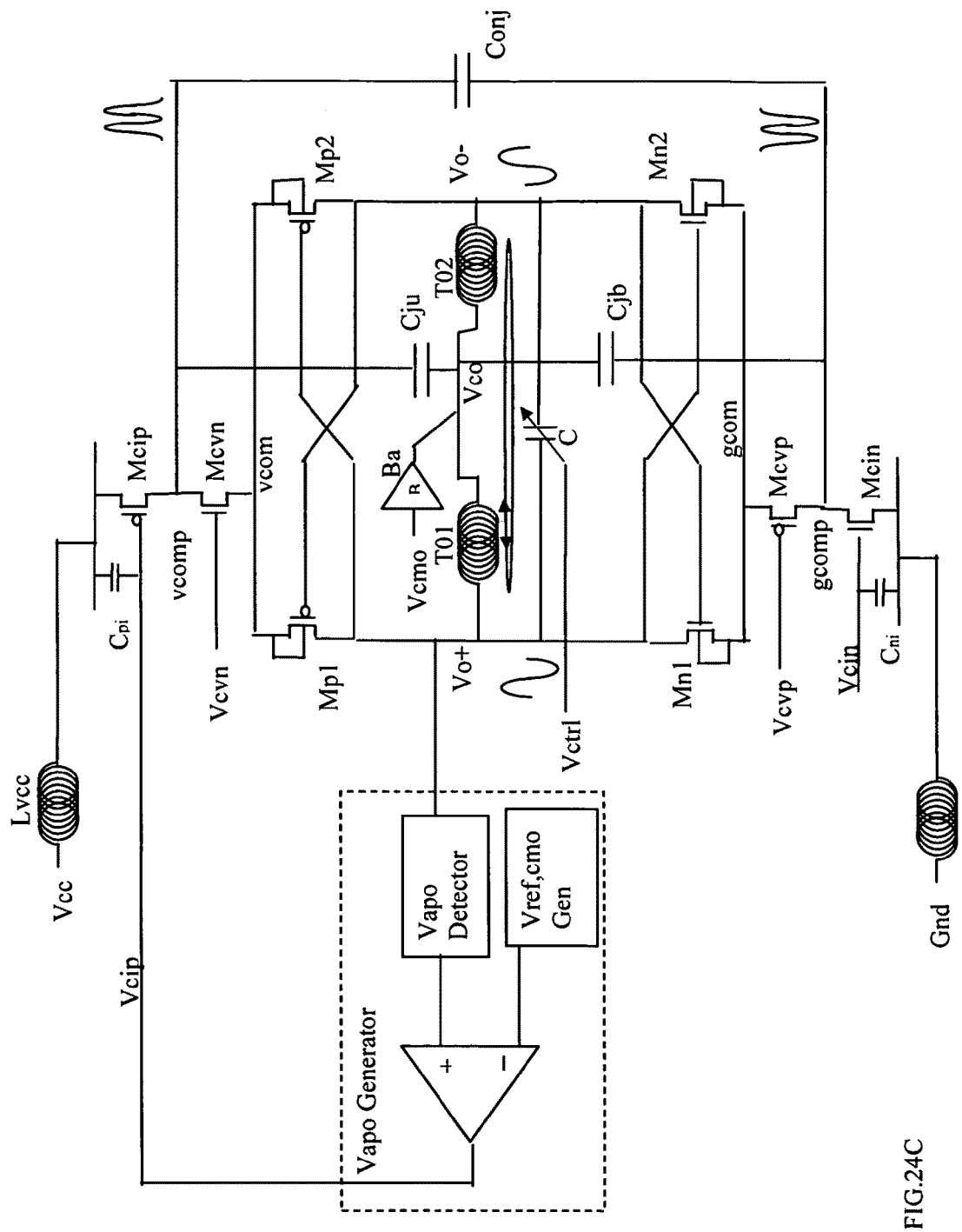

FIG. 24 is the common mode specified LCO resonator; (A) is the DFY LCO having the specified common mode voltage mechanism; (B) is the LCO having the common mode voltage specified and the current sources having the feedback for constant amplitude; one current source is the current mirror of the current source which controls the constant amplitude of oscillation; (C) is the DFY LCO having the common mode voltage specified with two inductors being made of the transformer.

FIG. 25 (A) is the self-compensation DFY clock reference circuit; (B) is the idealized LCO tank; (B) is the self-compensation LCO tank; (D) is the general configuration of the self-compensation LCO tank.

DESCRIPTION AND OPERATION

Figure 1:
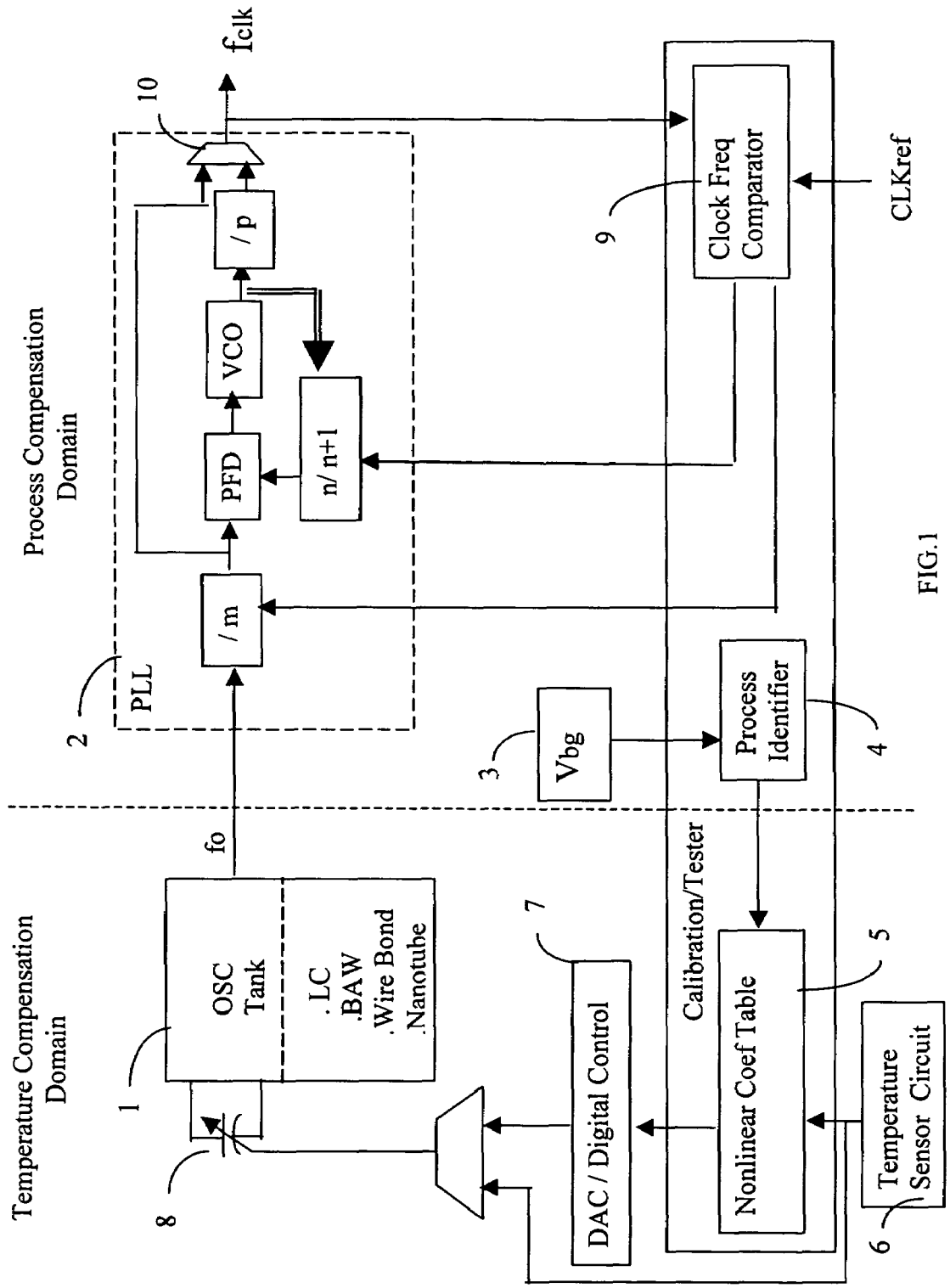
FIG. 1 is the block diagram of the DFY Trimming-Free Crystal-Free Precision Reference Clock Oscillator IC chip.

FIG. 1 shows the XTALCLKCHIP (Trademark for a chip equivalent to a clock chip and including means equivalent to a crystal resonator) having the oscillator tank 1 without any external disturbance and the phase-lock loop 2 which can generate any frequency which is specified by the customers. The XTALCLKCHIP (Trademark for a chip equivalent to a clock chip and including means equivalent to a crystal resonator) adopts the most advanced hierarchical PVTAN (Process-Voltage-Temperature-Aging-Noise) design. In this design, we adopt the most advanced SOC IC circuit design techniques which haven't shown anywhere. Being similar to the layout having the floor plan before the place and routing, we have the noise plan and power plan before designing the individual circuit modules. Being similar to the digital circuit having the timing analysis and verification after the logic function design and verification, for the analog circuit design, we have the noise analysis and verification after the analog function design and verification. In the SOC IC design, we use the hierarchical circuit design which is the application of the hierarchical system control theory. Instead of using the centralized LDVR, we adopt the distributed LDVR to save power and make the good isolation of noise. Furthermore, we invent the bonding capacitor package techniques to attach the high-density high capacitance fringe capacitor to the top of the IC. It saves the pin and enhance the performance of the chip.

The design principle of the XTALCLKCHIP (Trademark for a chip equivalent to a clock chip and including means equivalent to a crystal resonator) is to adopt the divide-and-conquer methodology to divide the PVT (process-voltage-temperature) variation to be two orthogonal domains of the temperature compensation domain and the process compensation domain. For the voltage variance of the power supply and the noise of power and ground, we design the XtalClockChip with PSRR AC testing.

Figure 2:
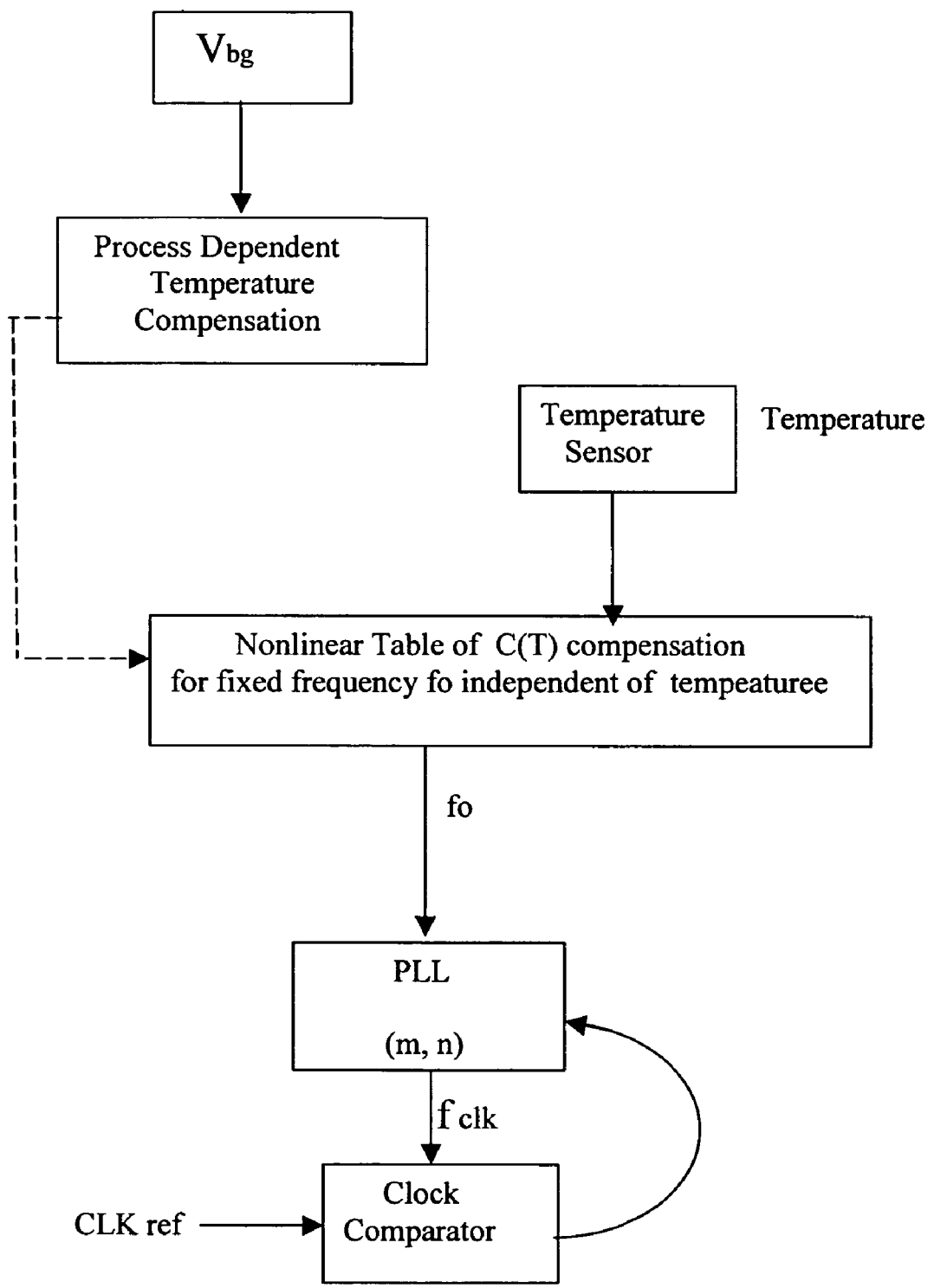
FIG. 2 is the calibration flow of the DFY XTALCLKCHIP (Trademark for a chip equivalent to a clock chip and including means equivalent to a crystal resonator).

As shown in FIG. 2, it is the calibration and testing flow of the XTALCLKCHIP (Trademark for a chip equivalent to a clock chip and including means equivalent to a crystal resonator). Referring to FIG. 1 and FIG. 2, the bandgap reference voltage $V_{bg}$ 3 generates the $V_{bg}$ of the chip. The process identifier 4 reads out the $V_{bg}$ voltage can tell what kind process (SS, TT, FF, etc) of the XTALCLKCHIP (Trademark for a chip equivalent to a clock chip and including means equivalent to a crystal resonator) is, where S is slow process, T is typical process and F is the fast process.

After the process of the XTALCLKCHIP (Trademark for a chip equivalent to a clock chip and including means equivalent to a crystal resonator) is identified, the nonlinear coefficient table 5 is loaded into the XtalClockChip. The temperature sensor circuit 6 is to sense the temperature of the XtalClockChip. According to the temperature of the XTALCLKCHIP (Trademark for a chip equivalent to a clock chip and including means equivalent to a crystal resonator), the proper nonlinear coefficient is selected and the value is sent to the DAC or digital control 7 to control the capacitor 8 of the oscillator tank 1 to generate the fixed oscillation frequency $f_o$. Since the oscillation tank 1 has no external disturbance, so it is very stable in its output oscillation frequency $f_o$.

No matter how, our XTALCLKCHIP (Trademark for a chip equivalent to a clock chip and including means equivalent to a crystal resonator) has much better quality and flexibility for the customer than the conventional dividing the oscillation tank oscillation frequency $f_o$ down to 24 MHz then boost with customer's own PLL. The less signal processes to the final customer's clock, the better the signal quality is. From the whole system view, the XTALCLKCHIP (Trademark for a chip equivalent to a clock chip and including means equivalent to a crystal resonator) can generate the output directly for the customer, the clock performance will be much better than the divide the clock 1 GHz to be 24 MHz, and then the customer boosts the clock up with the PLLs to be the customer's clocks. In any case, no matter how, the PLL does need between the oscillator tank 1 and the customer clocks.

So, we have one on-chip fractional PLL 1 to convert the oscillation in GHz ranges to be the customer's specified clock. Adjusting the programmable variable m, n/n+1 and p, the $f_o$ is divided to be the fractional value of $f_{clk}=(n.f)*(f_o/m)/P$ where (n.f) means n digital with f fraction. As shown in FIG. 1, the output clock fclk is compared with the customer's specified input $CLK_{ref}$ and the parameters m and n are adjusted accordingly.

For the spread-spectrum clock, it is easily to programming the parameters of the multi-phase fractional PLL to have the cyclic spread-spectrum operation. For the multi-phase fractional PLL, the spread-spectrum clock is implemented with the parameters of PLL instead of the variance the LCO oscillation tank as the other's traditional clock chip does.

There is a bypass path of the PLL. If the customer just wants to read out the clock or the clock without the PLL, the MUX 10 can be selected to bypass the PLL to read out the $f_o$ or $f_o/m$ directly.

The XTALCLKCHIP (Trademark for a chip equivalent to a clock chip and including means equivalent to a crystal resonator) needs high precision LC tank and capacitor to decouple the noise in the LDVR, etc. However, as shown in FIG. 3A, in the traditional chip, they use the external capacitor and inductor or filter connected through the bonding wire 71, etc. The dotted line is the chip boundary. As shown in FIG. 3B, the parasitic inductor 17L of bonding wire 17, etc deteriorates all the performance. As shown in the FIG. 3C, in our XTALCLKCHIP (Trademark for a chip equivalent to a clock chip and including means equivalent to a crystal resonator), we adopt the bonding fringing capacitor, on-chip capacitor and on-chip Bulk Acoustic Wave (BAW).

Since the customer might use the fclk directly, so we provide the high quality output clock $f_{clk}$. As shown in FIG. 3D, it is the top chip Bulk Acoustic Wave (BAW) device which can be integrated on the top of the silicon chip. The quality factor Q is 1,500 for the BAW device. The electrode 13 and 14 clamp a piezoelectric layer 11. The piezoelectric layer 11 is above an air gap. The piezoelectric layer 11, electrodes 13 and 14 are constituted of an MEM type inductor which can be integrated on the top of silicon isolator 15 and the silicon wafer 16.

Figure 3E:
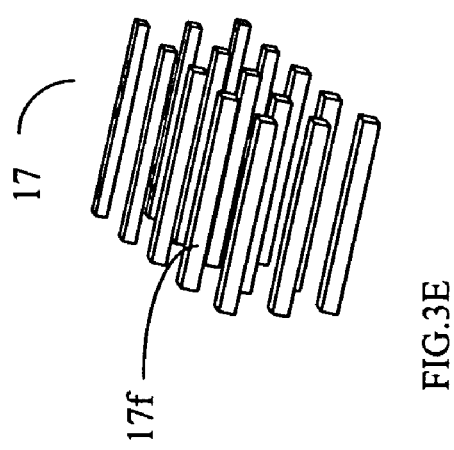
FIG. 3 is the off-chip capacitor and filter or inductor; (A) is the external capacitor and filter or inductor; (B) is the equivalent circuit of FIG. 3A; (C) is the on-chip capacitor, bonding-capacitor, and BAW filter or inductor; (D) is the cross-section of the BAW; (E) is the fringe-capacitor; (F) is the bonding-capacitor.
Figure 3F:
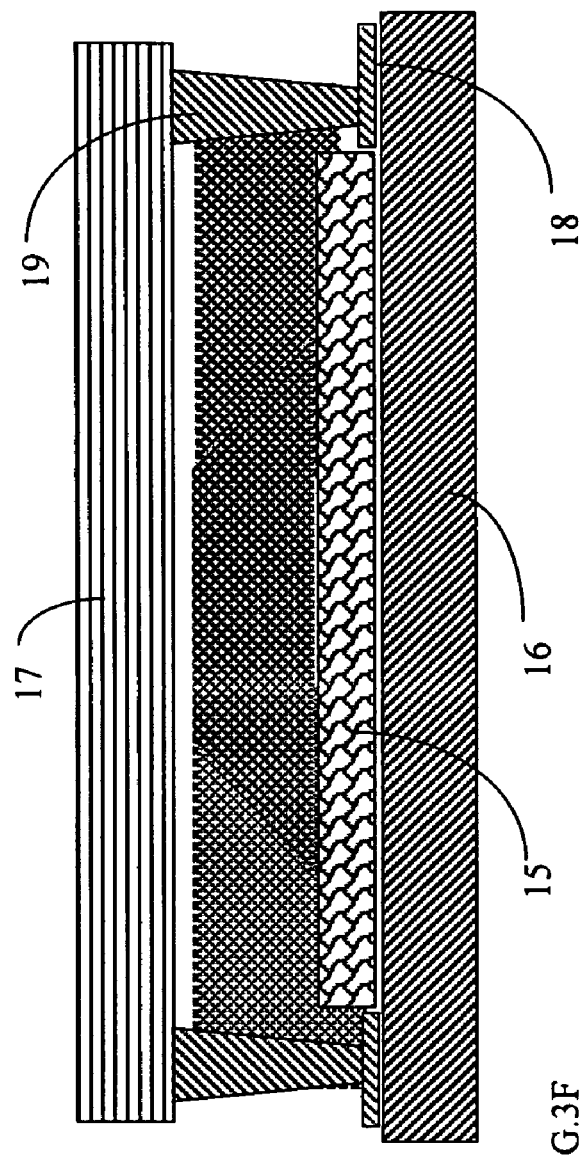

As shown in FIG. 3E, the fringe capacitor 17 has the capacitor strip 17f piled up to be 3D structure. The high-density capacitor modules can be bonded to the pad 18 directly to be the bonding capacitor. The high-density fringe strip fringing capacitor 17 can also bond to any position 18p over the chip as shown in FIG. 3C.

Figure 4:
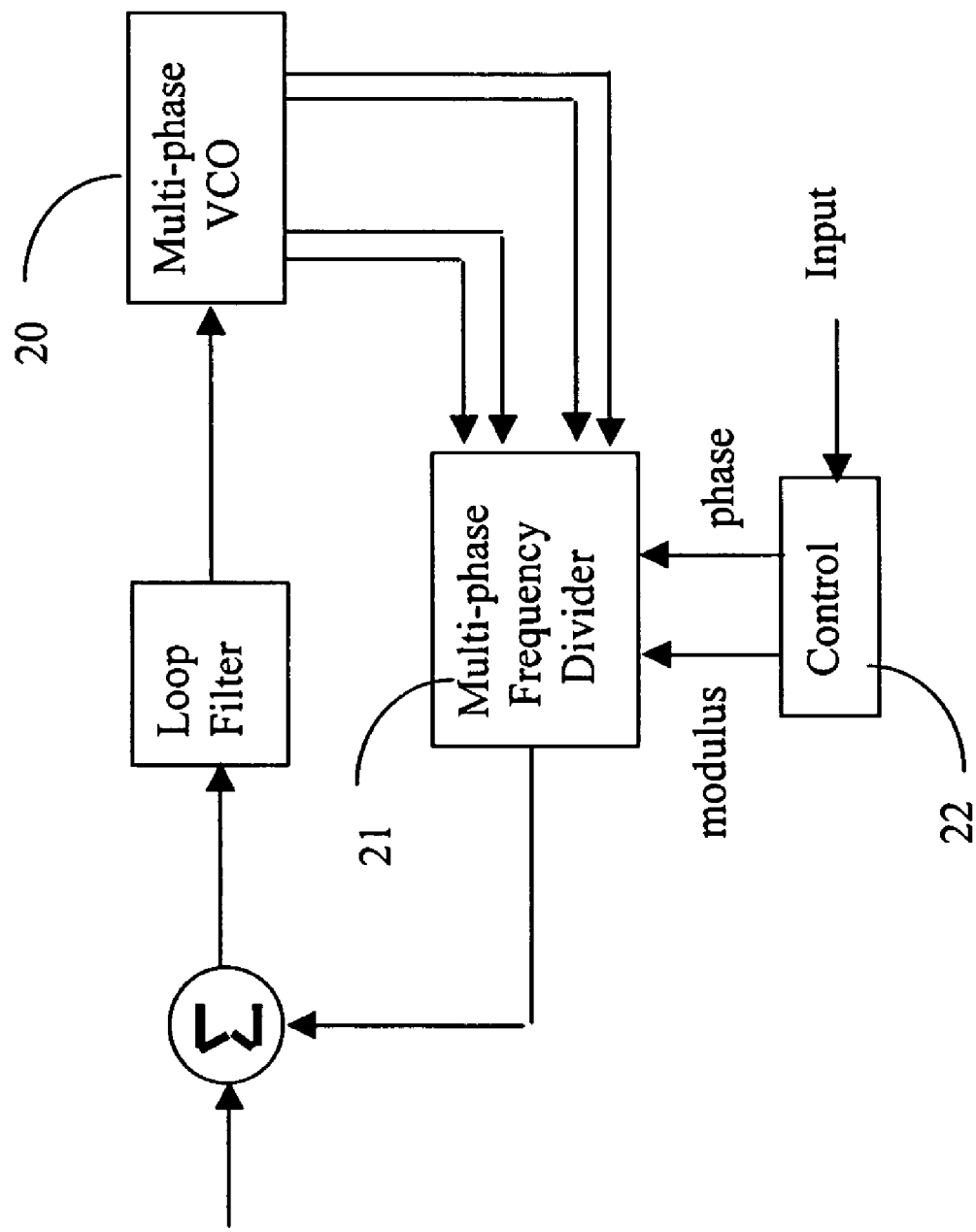
FIG. 4 is the block diagram of the multi-phase fractional-PLL.
Figure 9:
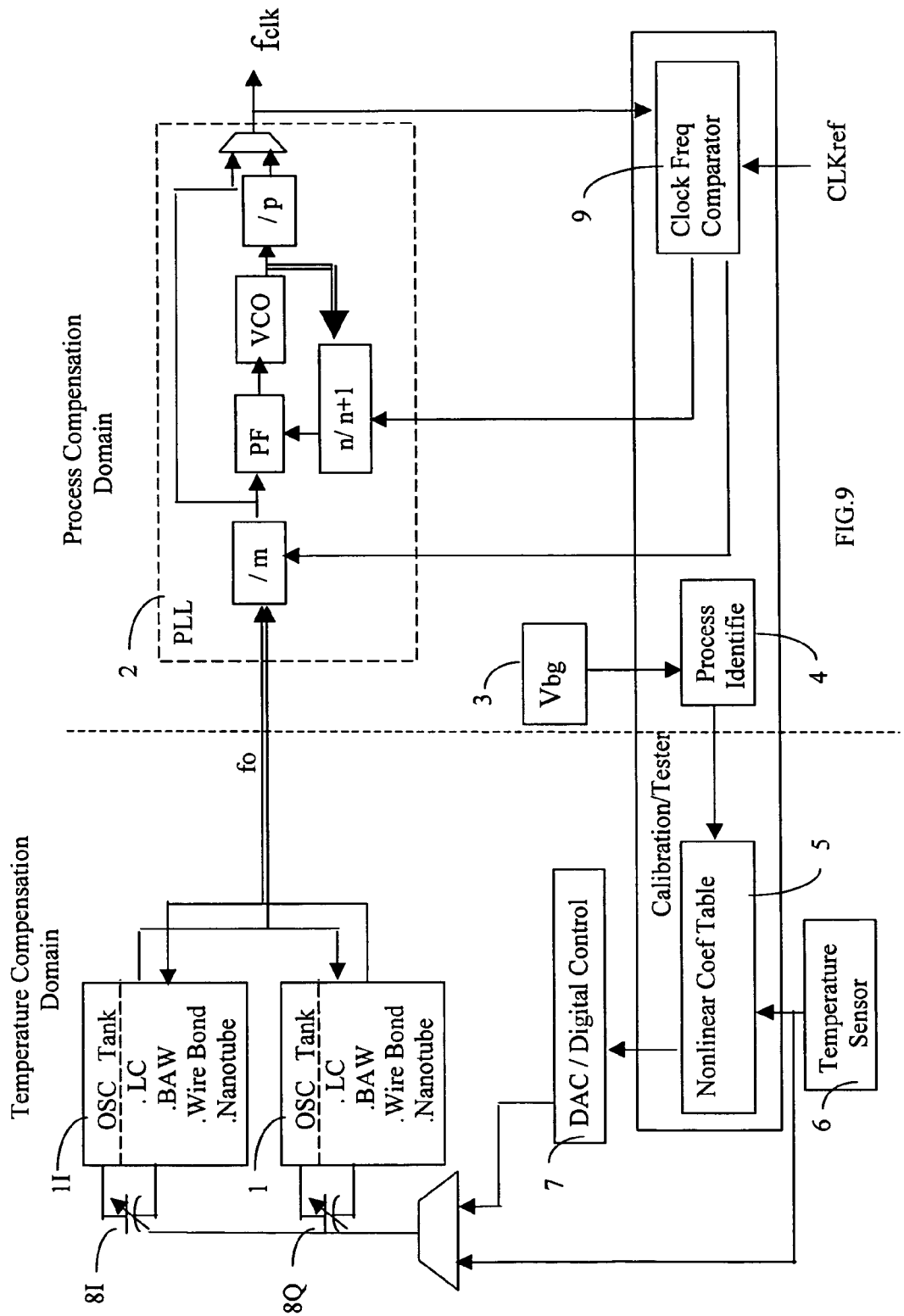
FIG. 9 is the block diagram of the DFY XTALCLKCHIP (Trademark for a chip equivalent to a clock chip and including means equivalent to a crystal resonator) with the IQ oscillators to enhance the Q factor of the oscillator tank and having the quadratic phase clock for the multi-phase fractional PLL.

FIG. 4 shows the detailed block diagram of the fractional PLL. To generate the fractional PLL clock, the divider is swapped between the n and n+1 modules having the multiple phases of fractional PLL. It has 0 degrees, 90 degrees, 180 degrees, 270 degrees multiple phases. There are two ways to generate the 4 phases of clock. One way is to use the single VCO to have the two different connections of the (/2) dividers. The other way is to use the I and Q dual VCOs to generate the 4 phases clock as shown in FIG. 9. The multiple phases combines with the n/n+1 modules division will generate much more smooth transition in the factorial PLL transition. So the phase noise is much smaller.

In the XTALCLKCHIP (Trademark for a chip equivalent to a clock chip and including means equivalent to a crystal resonator) design, we use the most advanced hierarchical circuit design for the NPVTA design process. FIG. 12 shows the circuit implementation of the LC tank. Combining the high Q=1500 BAW LC tank and the multi-phase factorial PLL, the XTALCLKCHIP (Trademark for a chip equivalent to a clock chip and including means equivalent to a crystal resonator) performance will be much higher than the traditional crystal clock circuit. Now, the XTALCLKCHIP (Trademark for a chip equivalent to a clock chip and including means equivalent to a crystal resonator) is not to emulate and try to catch the performance of the traditional crystal clock circuit. The XTALCLKCHIP (Trademark for a chip equivalent to a clock chip and including means equivalent to a crystal resonator) has the much superior performance to the traditional crystal circuit.

Figure 5A:
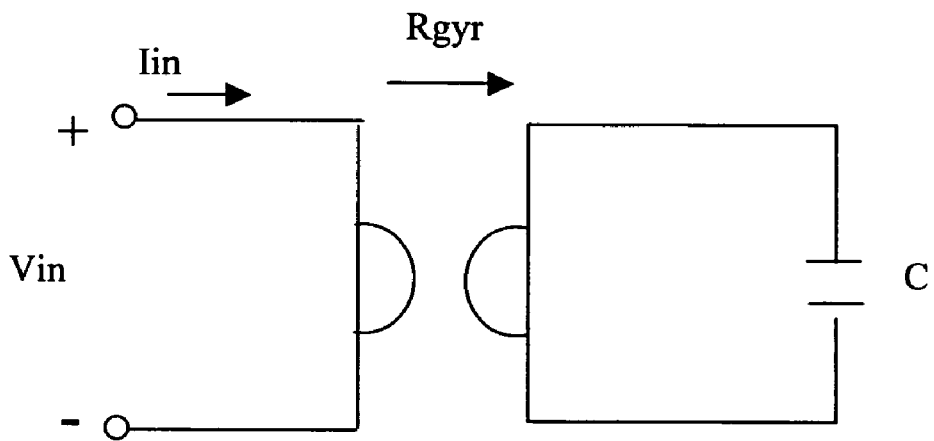
FIG. 5 (A) is the inductor made of the gyrator and capacitor; (B) is the inductors made of the bonding wires; (C) is the schematics of the LCO made of the inductors of bonding wires.
Figure 5B:
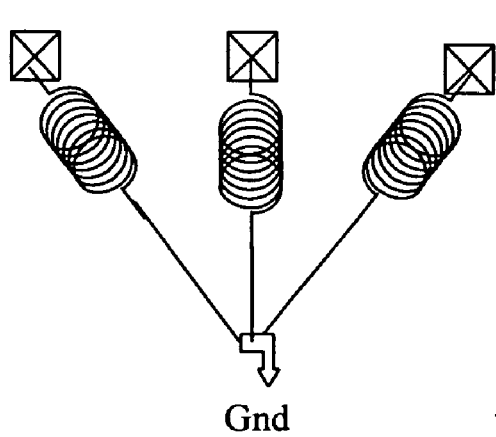
Figure 5C:
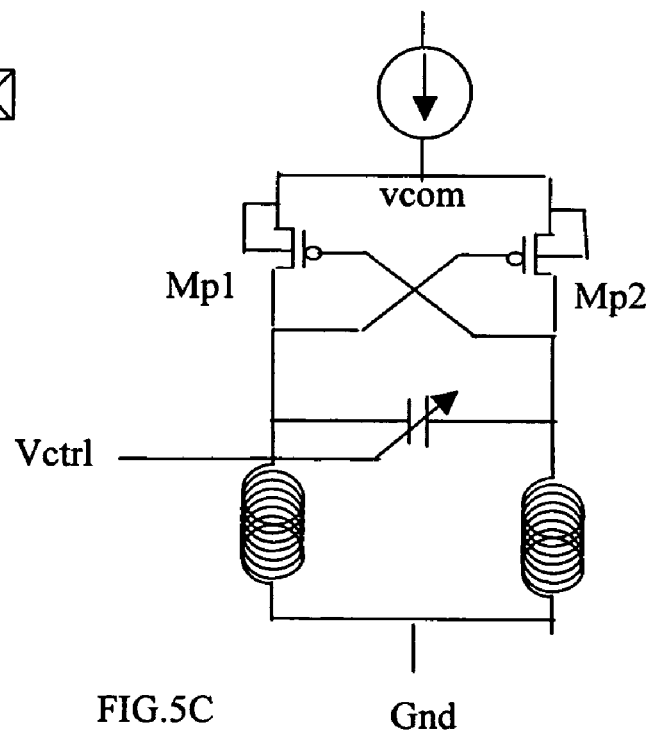

For the low performance XTALCLKCHIP (Trademark for a chip equivalent to a clock chip and including means equivalent to a crystal resonator), the inductor can be replace with the gyrator and C as shown in FIG. 5A or the bonding wire as shown in FIG. 5B or nano-tube. FIG. 5C shows the LCO made of the inductors made of the bonding wires as shown in FIG. 5B.

Figure 6A:
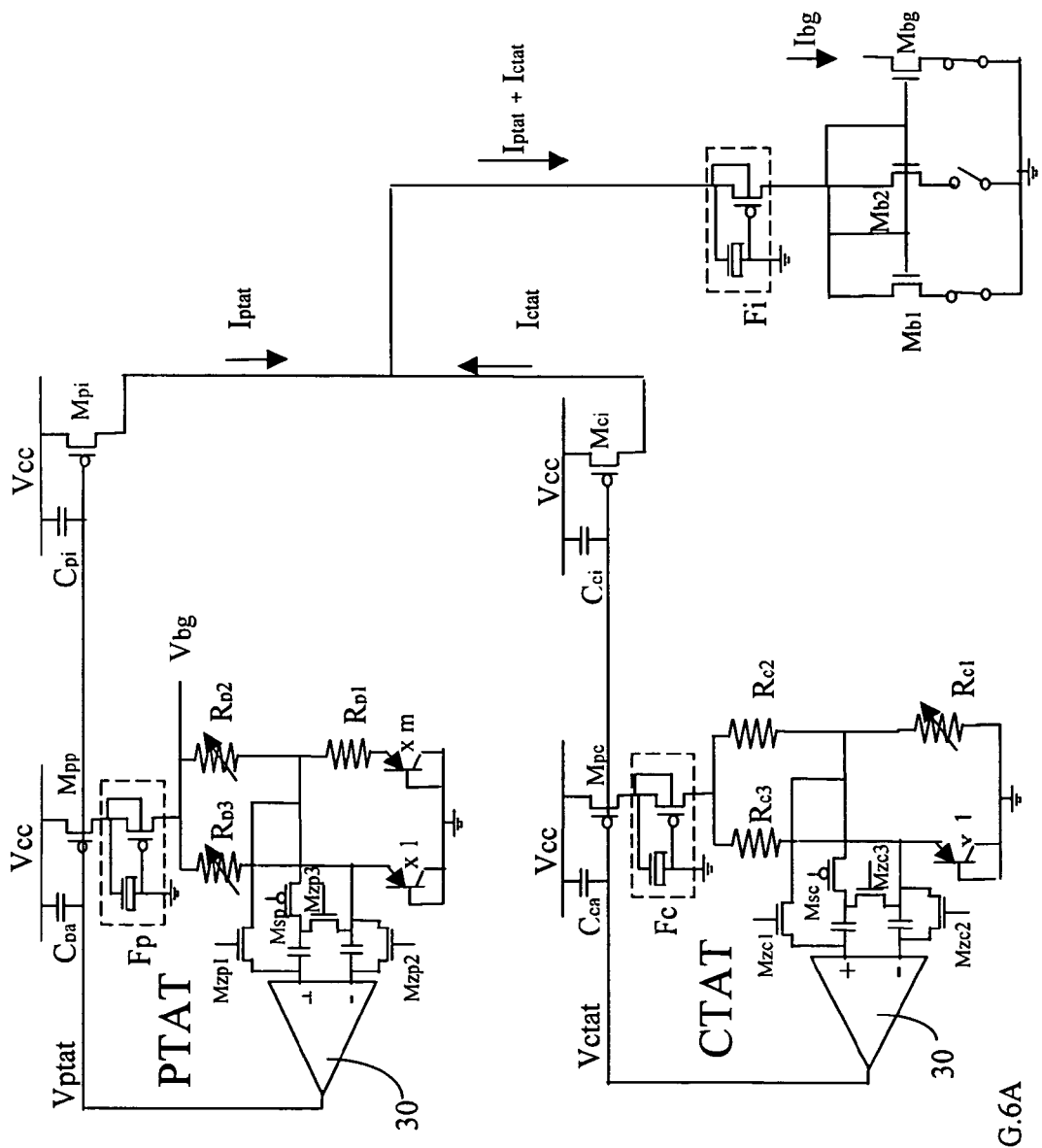
FIG. 6 (A) is the schematic of the bandgap reference voltage $V_{bg}$ and the bandgap reference current $I_{bg}$; (B) is the global and local partition of the hierarchical circuit design in the frequency domain; (C) is the noise design with the PSRR in the hierarchical circuit design.
Figure 6B:
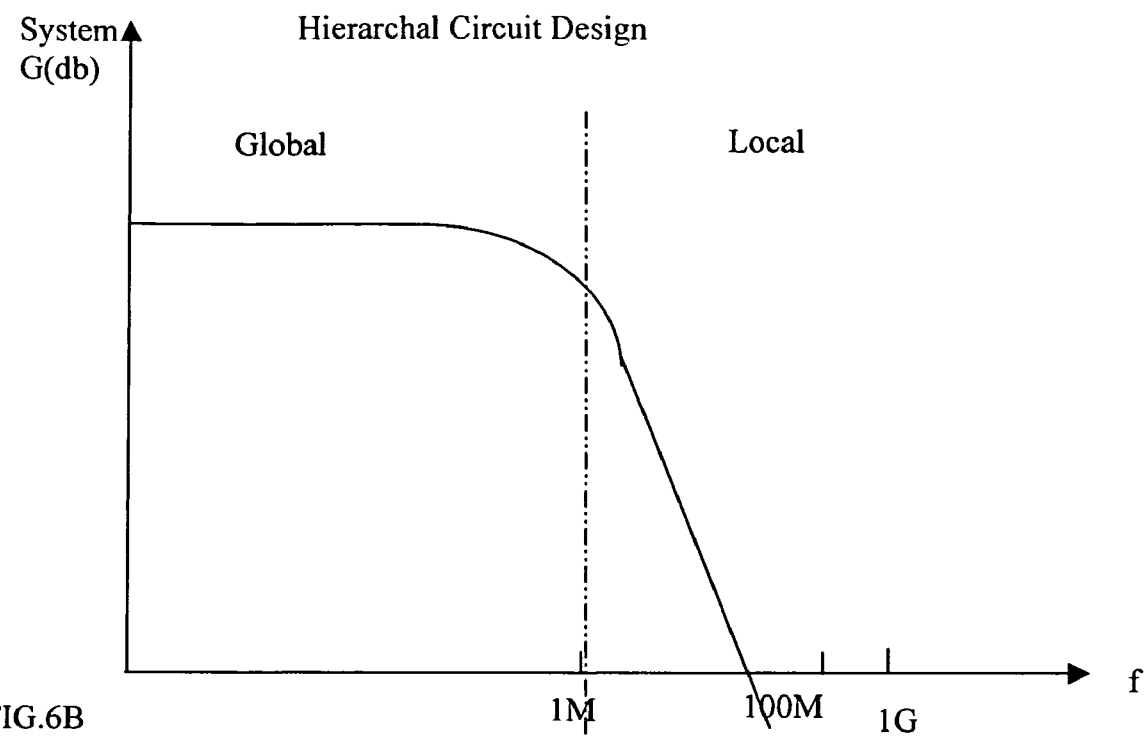
Figure 6C:
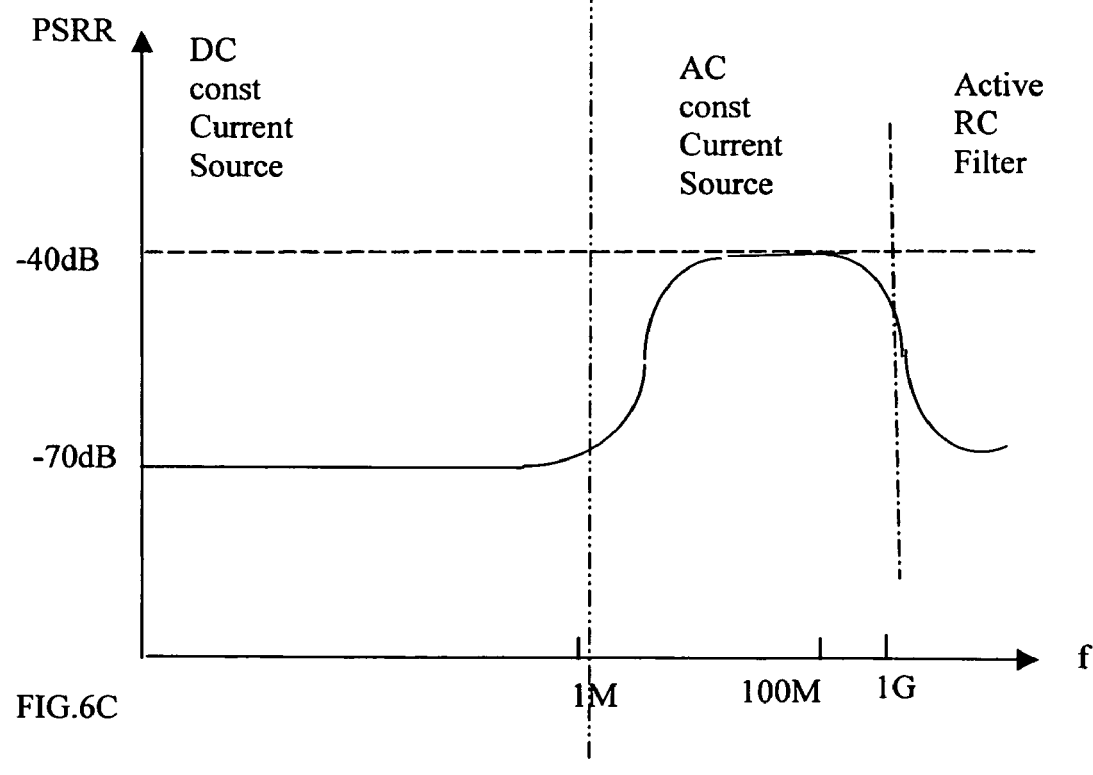
Figure 7A:
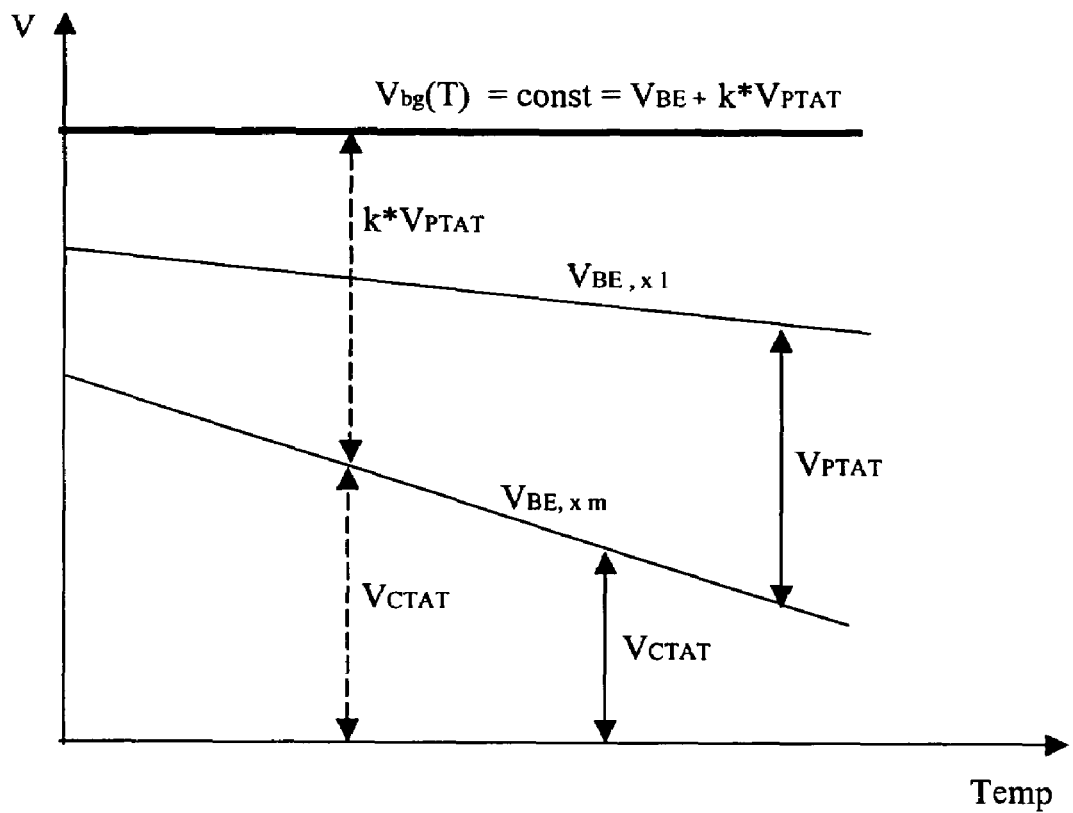
FIG. 7 (A) is the $V_{bg}$, $V_{ptat}$ and $V_{ctat}$ graphical relation; (B) is the $I_{bg}$, $I_{ptat}$ and $I_{ctat}$ graphical relation.
Figure 7B:
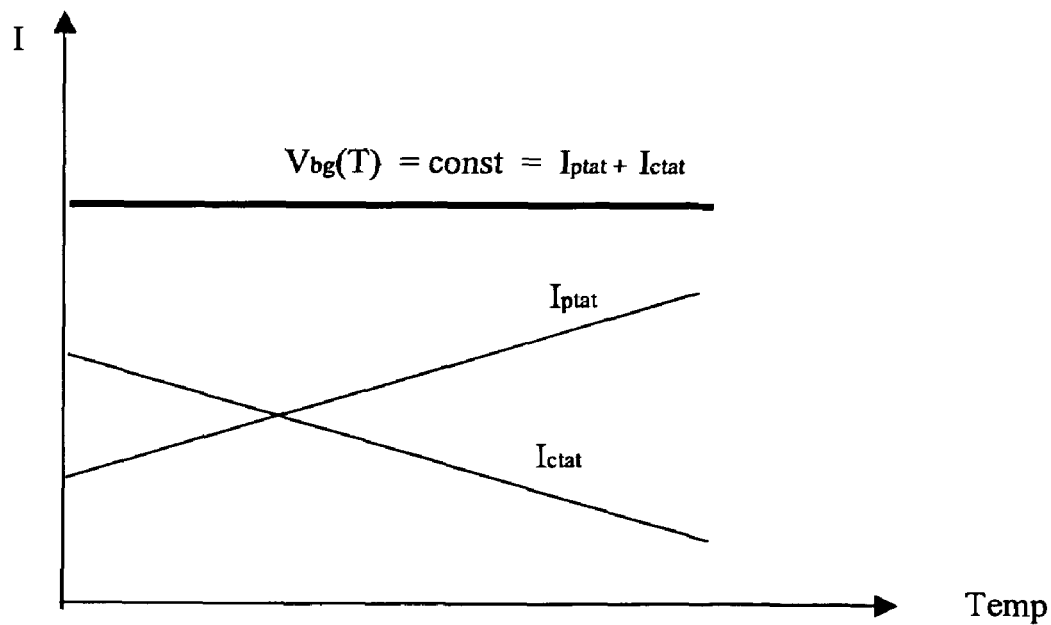

As shown in FIG. 6 and FIG. 7, PTAT is Proportional To Absolute Temperature; CTAT is Conjugate To Absolute Temperature where (x1) and (x m) is the scaling factor of the bipolar devices in bandgap reference circuit. The bandgap voltage reference is $V_{bg}$=Vptat+Vctat. The bandgap reference current is $I_{bg}$=k*(Iptat+Ictat). FIG. 6A is the circuit implementation of the graphic representation of the $V_{bg}$ and $I_{bg}$ in FIG. 7.

FIG. 6 shows the hierarchical circuit applied to the bandgap reference design. FIG. 6B shows the necessity of the partition of the bandgap reference circuit to be the hierarchical circuit. Due to the bandwidth limit of the OPAMP, the circuit is partitioned to be the global circuit and the local circuit. It is noted that the global level circuit is from the DC to the OPAMP bandwidth. The global circuit is served as the operating point of the higher frequency local circuit.

The OPAMP adopted the self-contained voltage regulator circuit configuration. It makes the bandgap has the high PSRR. The bias voltages $V_{ptat}$ and $V_{ctat}$ are for the global control region. The capacitors Cap, Coca and Chi are for the local region of Meg Hz region. The RC filter $F_p$, $F_c$ and $F_i$ are for the local region of GHz range.

As shown in FIG. 6B, the OPAMP has the bandwidth limit. In the bandwidth of the OPAMP, the circuit is global control. Outside the bandwidth of the OPAMP, the bandgap reference circuit is in the mode of local control. As shown in FIG. 6C of AC analysis of the PSRR, the local region is further divided to be two local regions: the constant source region and the noise-filtering region. It is the hierarchical design applied to the noise design.

From the AC analysis of the PSRR (Power Supply Reject Ratio), the global region has the PSRR about −70 dB. It means that as the $V_{CC}$ power supply varies from 2.9V to 3.7V, the $V_{bg}$ is almost constant. It is the voltage variance in the PVTAN analysis. The higher the gain of the OPAMP is, the better PSRR in the global region is.

In the region of Mega Hz region which is outside the bandwidth of the OPAMP, we see the PSRR raises about −20 dB region. We need uses the local circuit $C_{pa}$, $C_{pi}$, $C_{pc}$ and $C_{ci}$ to keep the current source devices $M_{pp}$, $M_{pi}$, $M_{pc}$ and $M_{ci}$ to be constant current source to suppress the PSRR from −20 dB to −40 dB. It is the constant source region.

For the Giga Hz region, we need the local circuit $F_p$, $F_c$ and $F_i$ to filter out the power supply noise. It is in the noise-filtering region.

In the derivation of the $V_{bg}$ and $I_{bg}$, it is assumed that the input nodes of the OPAMP have the same voltage. The less deviation of the OPAMP input nodes voltage differences are, the better the $V_{bg}$ and $I_{bg}$ are. It is the reason why the high gain OPAMP 30 is adopted. Both the PTAT and CTAT circuit have the same circuit configuration. However, the offset voltage of the OPAMP causes the deviation of the ideal case. So the autozero circuit devices $M_{zp1}$, $M_{zp2}$, $M_{zp3}$ and $M_{sp}$ are adopted to autozero the total offset voltage of the whole bandgap circuit which includes the input offset voltage of the OPAMP 30.

Figure 8A:
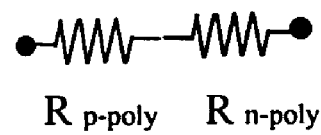
FIG. 8 (A) is the voltage compensation resistor unit; (B) is the temperature and voltage compensation of resistor with the ratio of two resistor applying to the programmable gain amplifier.

Furthermore, in the bandgap circuit, the resistance needs to be both temperature compensated and voltage compensated. To have the better control over the temperature variation and voltage variation, as shown in FIG. 8, the resistors are both voltage compensated and temperature compensated. The p-poly resistor has the positive coefficient over the temperature range. As the temperature increases, the p-poly resistance increases. The n-poly resistor has the negative coefficient over the temperature range. As the temperature increases, the n-poly resistance decreases. FIG. 8A shows the combined resistor has the weighting p-poly resistor and the weighting n-poly resistor has the temperature coefficient (TC) to be 0. This is the unit resistance which has the constant resistance over the temperature range.

Figure 8B:
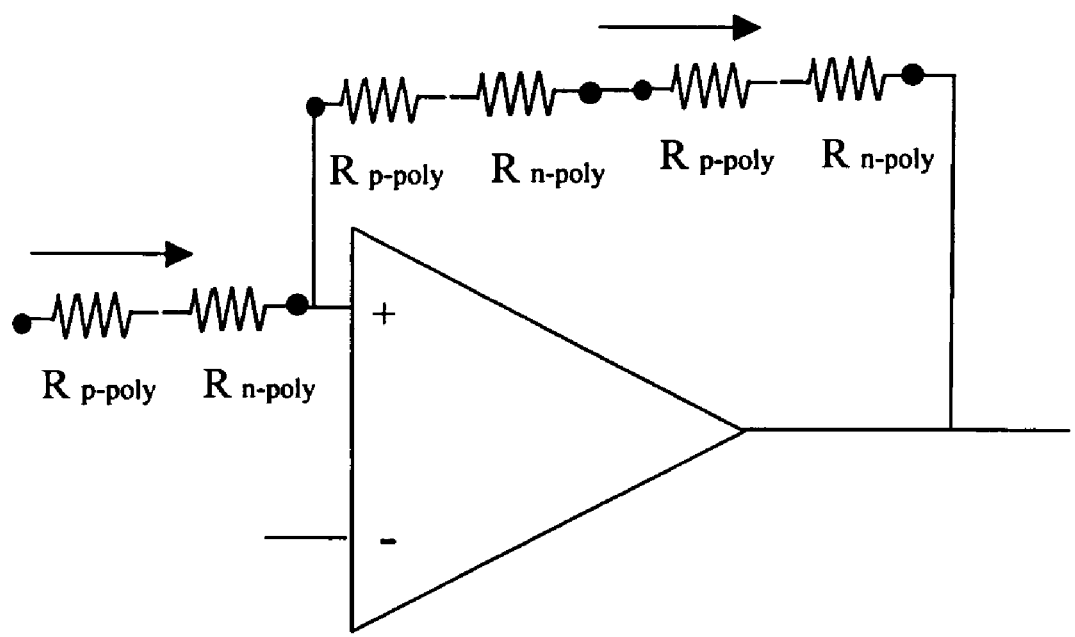

FIG. 8B shows the circuit configuration of the voltage compensated resistor which is made of the unit resistors. All the unit resistors are connected in series and have the same amount current passing through all the unit resistors. So the voltage differences between two ends of the resistors are the same. So, the voltage is compensated for all the unit resistors. For the variable gain amplifier, the voltage-temperature-compensated unit resistor can eliminate the harmonic distortion of the signal. For the bandgap reference circuit, the voltage-temperature-compensated unit resistor can have much better constant reference voltage $V_{bg}$ and reference current $I_{bg}$.

Having the temperature and voltage compensated $V_{bg}$, $I_{bg}$ and resistors, etc, then we can use the $V_{bg}$ and $I_{bg}$ to generate the fo from the oscillation tank 1. FIG. 12 shows the circuit implementation of the LC tank for the oscillation tank 1.

FIG. 9 shows the quality factor Q of the oscillator tank 1 can be increased with the IQ quadratic oscillator 8I and 8Q configuration. The LC oscillation tank is a filter. The oscillation of one tank 8I feeds the oscillation signal into the other oscillation tank 8Q and the oscillation signal is filtered by the other oscillation tank, and vice versa. The I and Q oscillation tanks mutually feed each other and mutually filtered by each other. This mutual-filtering process make the output oscillation signal has high Q.

Figure 10:
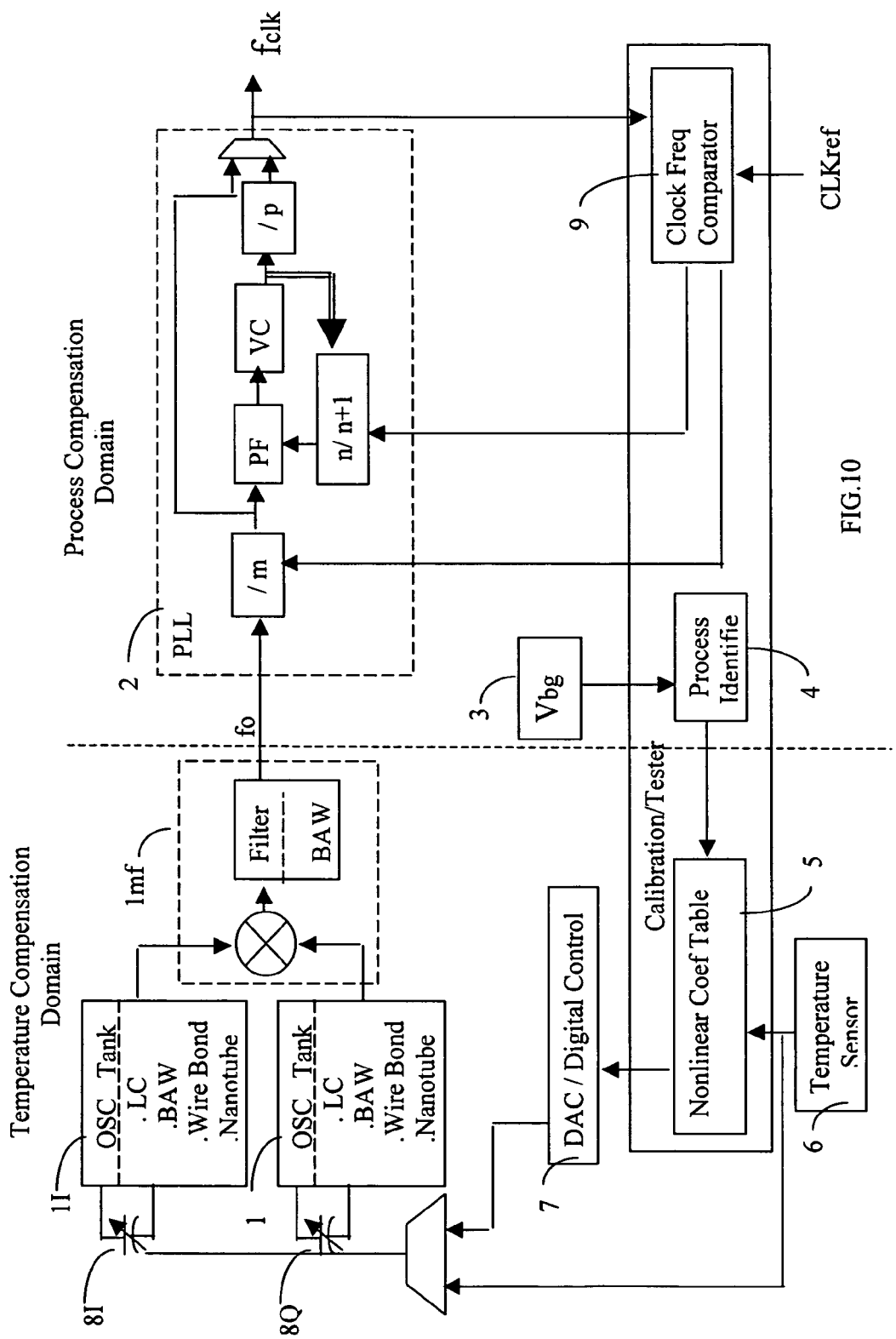
FIG. 10 is the block diagram of the DFY XTALCLKCHIP (Trademark for a chip equivalent to a clock chip and including means equivalent to a crystal resonator) with the dual LCO having the aging capability.

FIG. 10 shows the dual oscillator circuit configuration can compensate for the aging of the oscillator tank. The oscillator $1_I$ oscillates at frequency $f_1$. The oscillator $1_Q$ oscillates at frequency $f_2$. The output frequency fo of the filtering mixer me is $(f_1-f_2)$. The filter can be either low-pass filter or band-pass filter. Furthermore, the bandpass filter can be integrated with the mixer itself. The bandpass type circuit implementation of the filtering mixer $1_{mf}$ is shown as FIG. 14.

FIG. 11 shows the hierarchical circuit with noise design circuit applying to the LDVR (Low Drop Voltage Regulator). FIG. 11A is the LDVR without the need of the compensation of the external capacitor. In the conventional LDVR design, they used the flat circuit design. They never use the hierarchical circuit design in the noise design style circuit. It is extremely difficult for the flat circuit design with solid power and ground design style engineers to understand the circuit designed by the hierarchical circuit design with noise circuit design style.

Figure 11A:
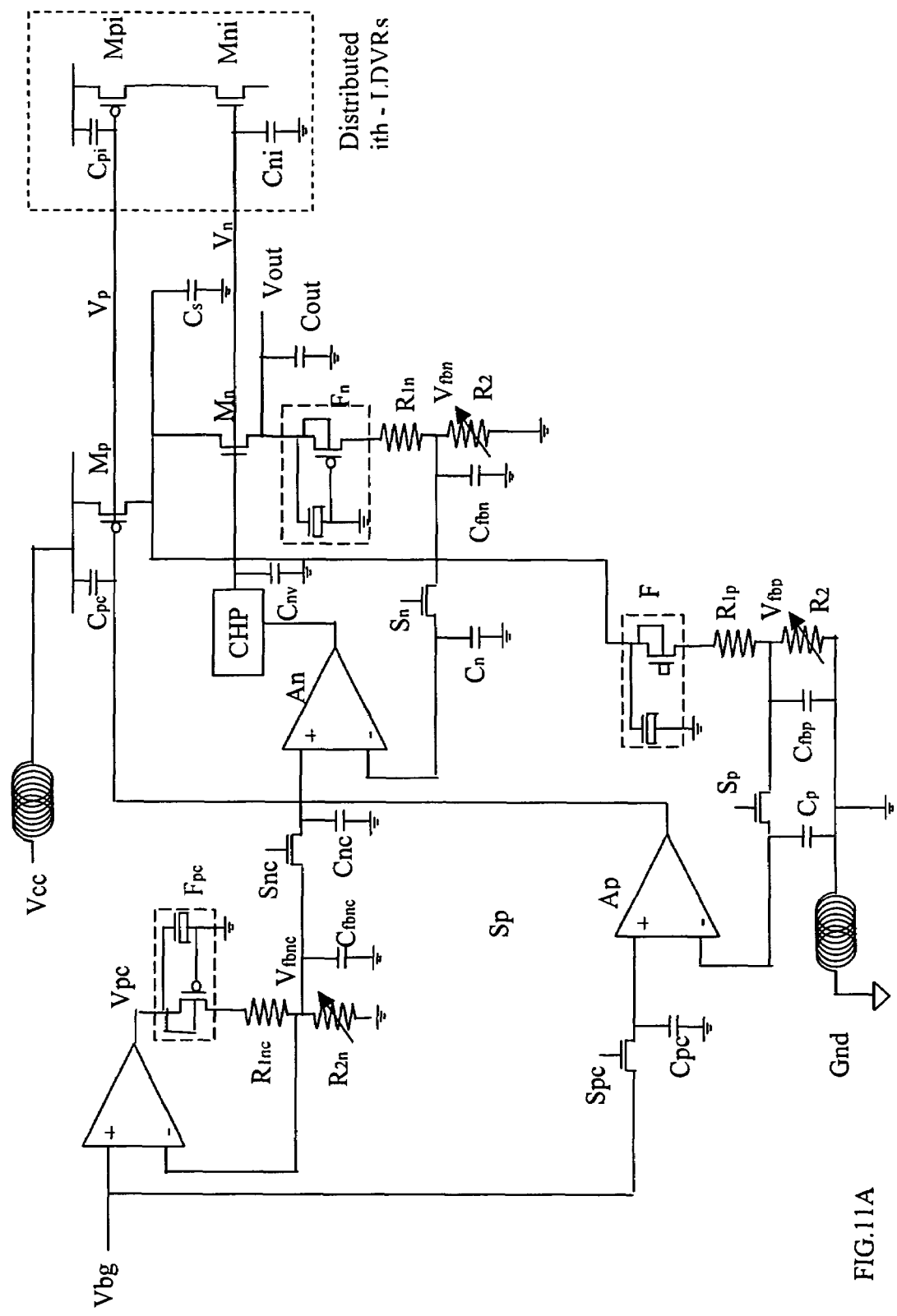
Figure 11B:
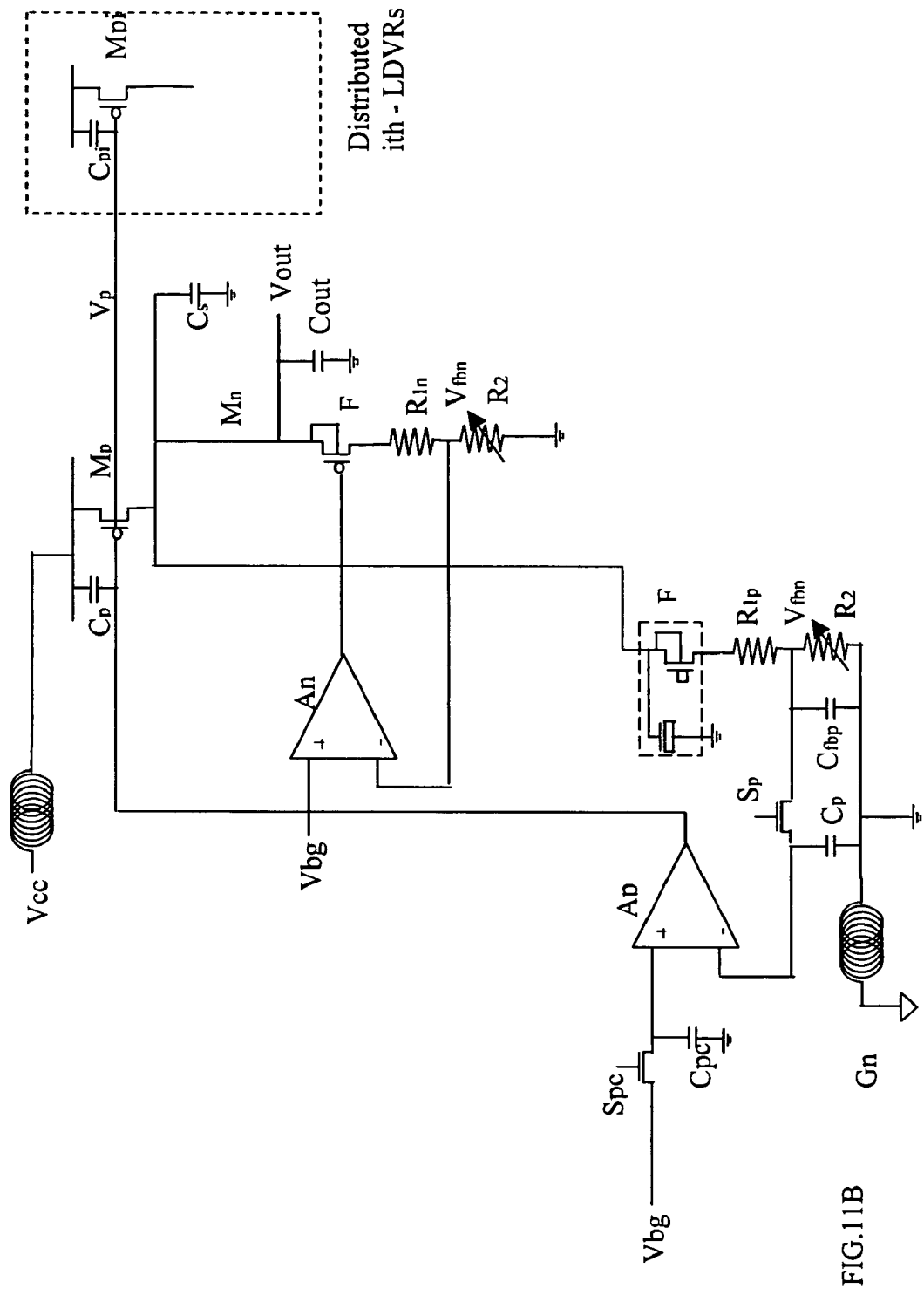
Figure 11C:
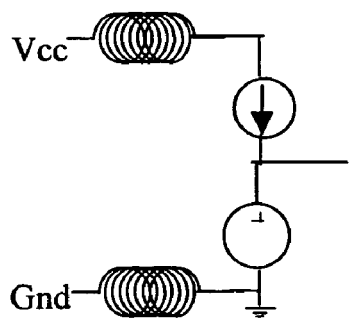
Figure 11D:
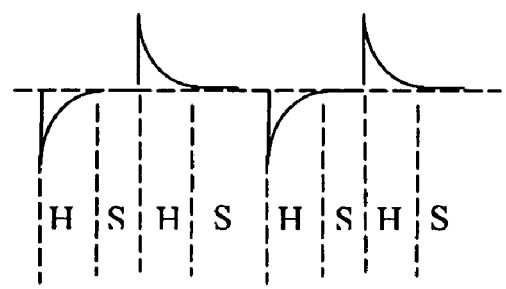

The other people's LDVR are based on the flat concept. So they use a lot of effort to boost up the OPAMP frequency response to have the higher bandwidth. Our LDVR uses the hierarchical circuit design to have the global circuit and the local circuit. As shown in FIG. 11A and FIG. 11D, there are the switch capacitor filter $S_p$ and $C_p$ to sample (S), hold (H), filter and average the feedback voltage $V_{fbp}$ and $V_{fbn}$ in the quite periods. The filter is a series of small filters instead of a giant external capacitor connected to the output node $V_p$. The filter $F_p$ is to have much clean $V_{fbp}$ and $V_{fbn}$ signals. The switch capacitor can make the smart sample hold of the quite signal. The other flat circuit uses the giant external capacitor is equivalent to have the filter at the output node to filter the noise generated by the load. The hierarchical circuit uses much small smart switch capacitor to sample and hold the DC output voltage at the quite period. We use divide and conquer approach to divide the LDVR problem to be the global problem and the local problem. The global problem is to provide the constant current source to the output load. The local problem is to quench the noise generated by the output load. The local circuit is the NMOS device $M_n$ to boost up the high frequency response.

The other flat circuit design engineers do not recognize the problem that the load will generate the violent noise. So the traditional flat circuit design applied to the LDVR design is completely wrong. The biggest gap is the concept gap. The hierarchical circuit design concept and the flat circuit design concept have a large concept gap.

Figure 11E:
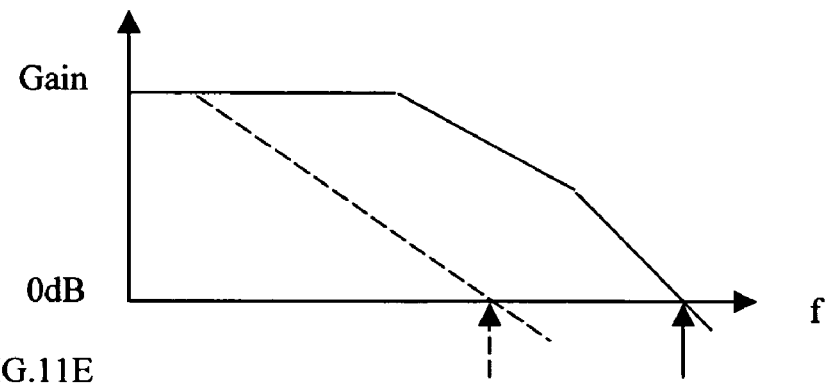
Figure 11F:
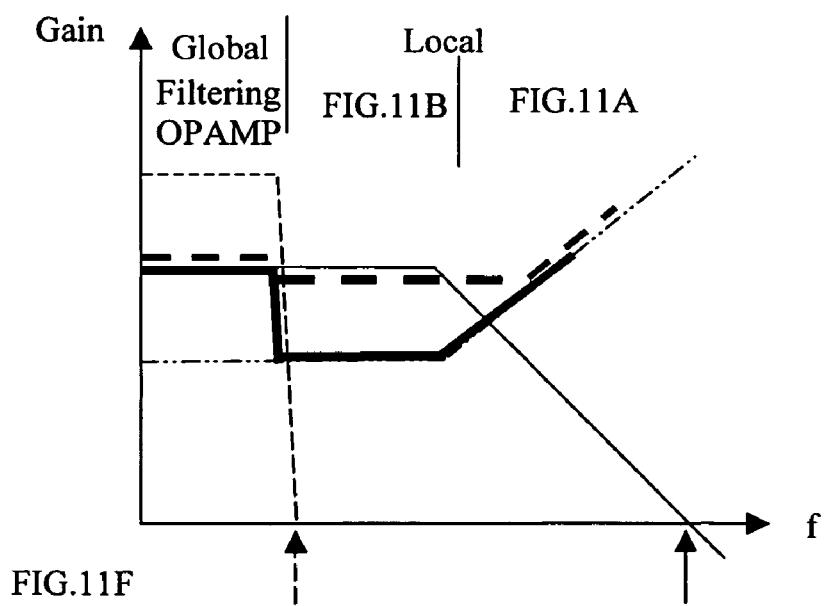

The OPAMP $A_p$ and $A_n$ had better to be the folding cascade OPAMP. The dominant pole is at the output nodes $V_p$ or $V_n$. As shown in FIG. 11E, for the conventional flat circuit design of LDVR, they use two stage OPAMP, it definitely has the stability problem that they have to use the external cap and waste one single pin. Furthermore, they have to use the compensation capacitor. As shown in FIG. 11E, the role of the compensator is to move the 0 db point as shown by the arrows. As shown in FIG. 11F, the filter has the same effect as the compensation capacitor. The switch capacitor $S_p$ and $C_p$ not only can adjust for the resistance but also to sample the average at the quite time. With the smart use of the switch capacitor in the hierarchical circuit design, we can get rid of the external giant capacitor and have much superior performance. We use the hierarchical design with noise circuit design style. The filter chain has the same effect of the compensation capacitor.

Referring to FIG. 11A, the voltage source device $M_n$ is biased at a constant voltage. If the output voltage $V_n$ is higher than the supply voltage $V_{cc}$, then the charging pump CHP circuit is needed. Except the charge pumping circuit CHP, the feedback loop control circuit has the similar circuit configuration as the current source device $M_p$ feedback loop control circuit.

Furthermore, even though we illustrate the complete circuit here, the LDVR circuit for $M_p$ and $M_n$ can share the resource to share the same circuit to simplify the design.

The hierarchical circuit design divides the frequency domain to be three ranges and each range has its circuit. The three ranges circuits cooperate to work together. As shown in FIG. 11F, the solid thick line is the curve for the FIG. 11A; the dotted thick line is the curve for the combination for FIG. 11A and FIG. 11B. FIG. 11B is for the LDVR circuit working in the middle Meg Hz range.

Figure 12A:
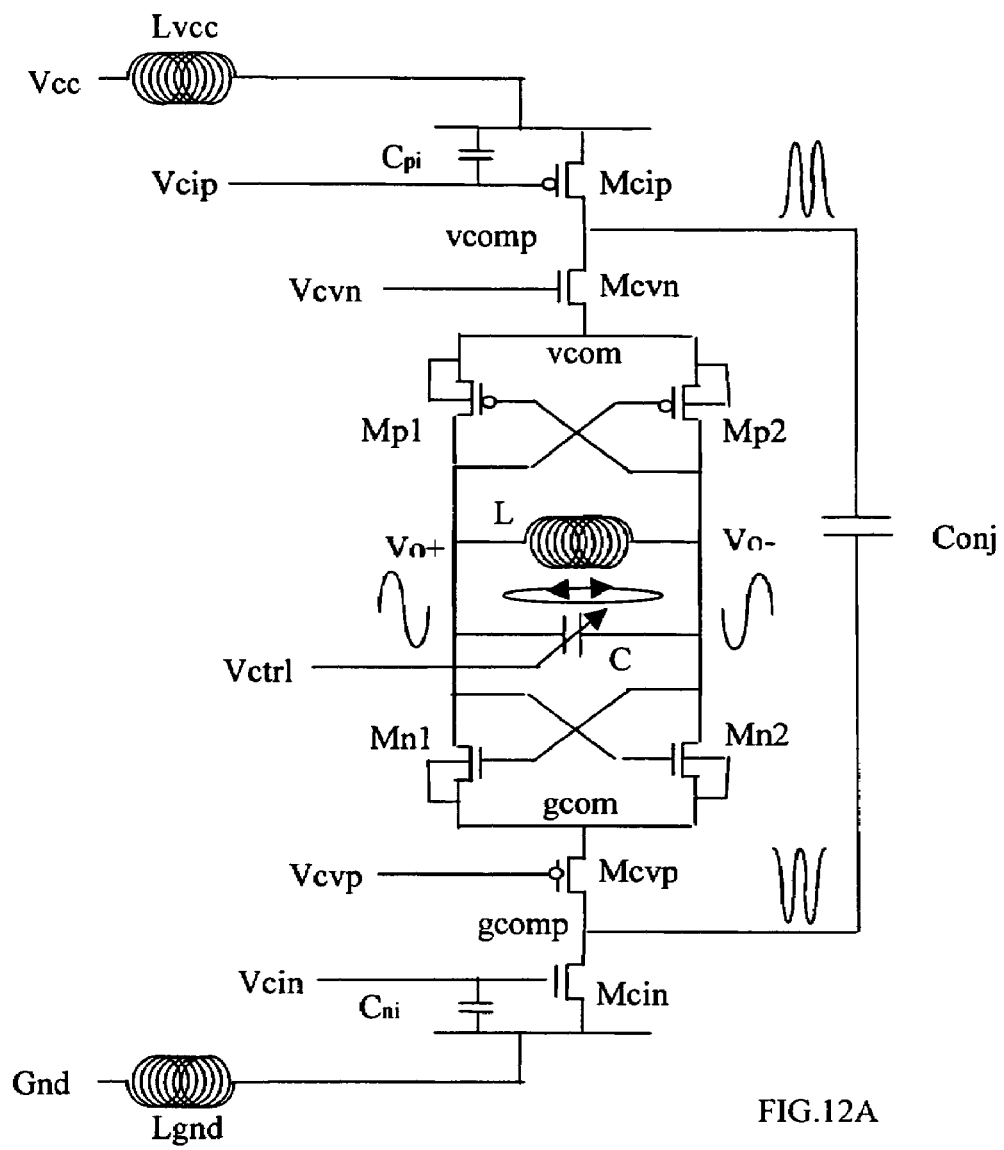

As shown in FIG. 11A, there are the distributed LDVRs. FIG. 12A is the LCO (LC Oscillator) with the embedded distributed LDVR circuit structure. With the embedded distributed LVDR, all the RF modules can have only one common LDVR and distributed LDVRs as shown in FIG. 11A. This embedded LDVRs of the power plan and noise plan make the XTALCLKCHIP (Trademark for a chip equivalent to a clock chip and including means equivalent to a crystal resonator) to have the solid P&G (Power and Ground).

Figure 12B:
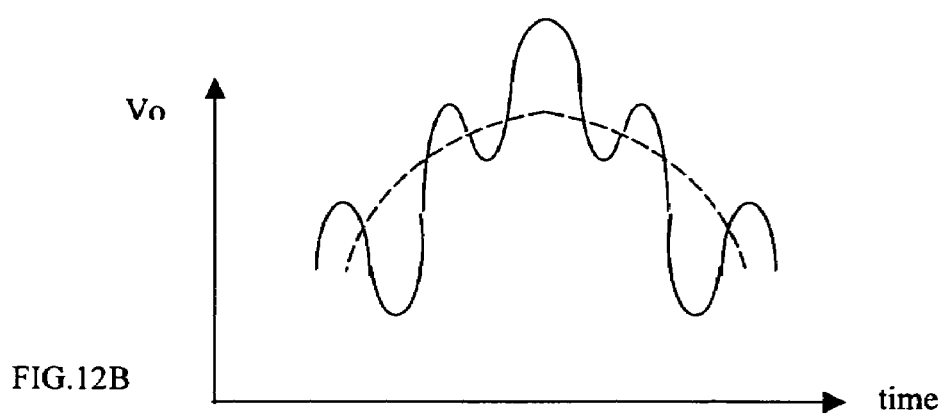

FIG. 12B shows the conventional LCO circuit having the ripple riding on the oscillation clock. This ripple is due to the current pulsing generated by the LCO flowing through the bonding wire $L_{vcc}$ and $L_{gnd}$. So, for noise style circuit design, we have to get rid of the ripple.

As shown in FIG. 12A, the LCO has the LC tank lies in the middle portion of the back-to-back connected latch style circuit. Instead of flows through the $M_{p1}$, $M_{p2}$, $M_{n1}$ and $M_{n2}$, the current and energy of the LC tank are cycling horizontally. Ideally, only the biasing current flows through the $M_{p1}$, $M_{p2}$, $M_{n1}$ and $M_{n2}$ to supply a small amount oscillation sustaining energy. So, the noise impact on the bonding wire $L_{vcc}$ and $L_{gnd}$ is minimized and the ripple noise generated by the $L_{vcc}$ and $L_{gnd}$ is minimized.

At the common nodes $v_{com}$ and $g_{com}$, there are the oscillation having the double frequency ($2*f_o$) and out of phase 180 degrees. This double frequency (x2 $f_o$) circuit is adopted this phenomena. However, the double frequency nodes voltage will feedback to the LCO and destroy the LCO performance. For the XTALCLKCHIP (Trademark for a chip equivalent to a clock chip and including means equivalent to a crystal resonator), the LCO must have the idealized solid power and ground (P&G). The solid P&G is implemented with the embedded LDVR having the capacitor $C_{onj}$ shorting the conjugating nodes $v_{com}$ and $g_{com}$. The oscillations at the conjugates nodes are 180 degrees out of phase and canceling each other.

However, no matter how large the capacitor Conj is, there are still has the ripples on the conjugate common nodes vcom and gcom. So we have the source follower devices $M_{cvn}$ and $M_{cvp}$ to move the double frequency (x2 $f_o$) oscillation to the compensation nodes $v_{comp}$ and $g_{comp}$. At the same time, the conjugate capacitor $C_{onj}$ can be reduced to gm times to be small capacitor ($C_{onj}$/gm).

$M_{cip}$ and $M_{cin}$ are the current source type device. $M_{cvn}$ and $M_{cvp}$ are the voltage source type device. All the strong LCO tank oscillation is floating and circulating in the middle of the negative feedback mechanism.

Figure 12C:
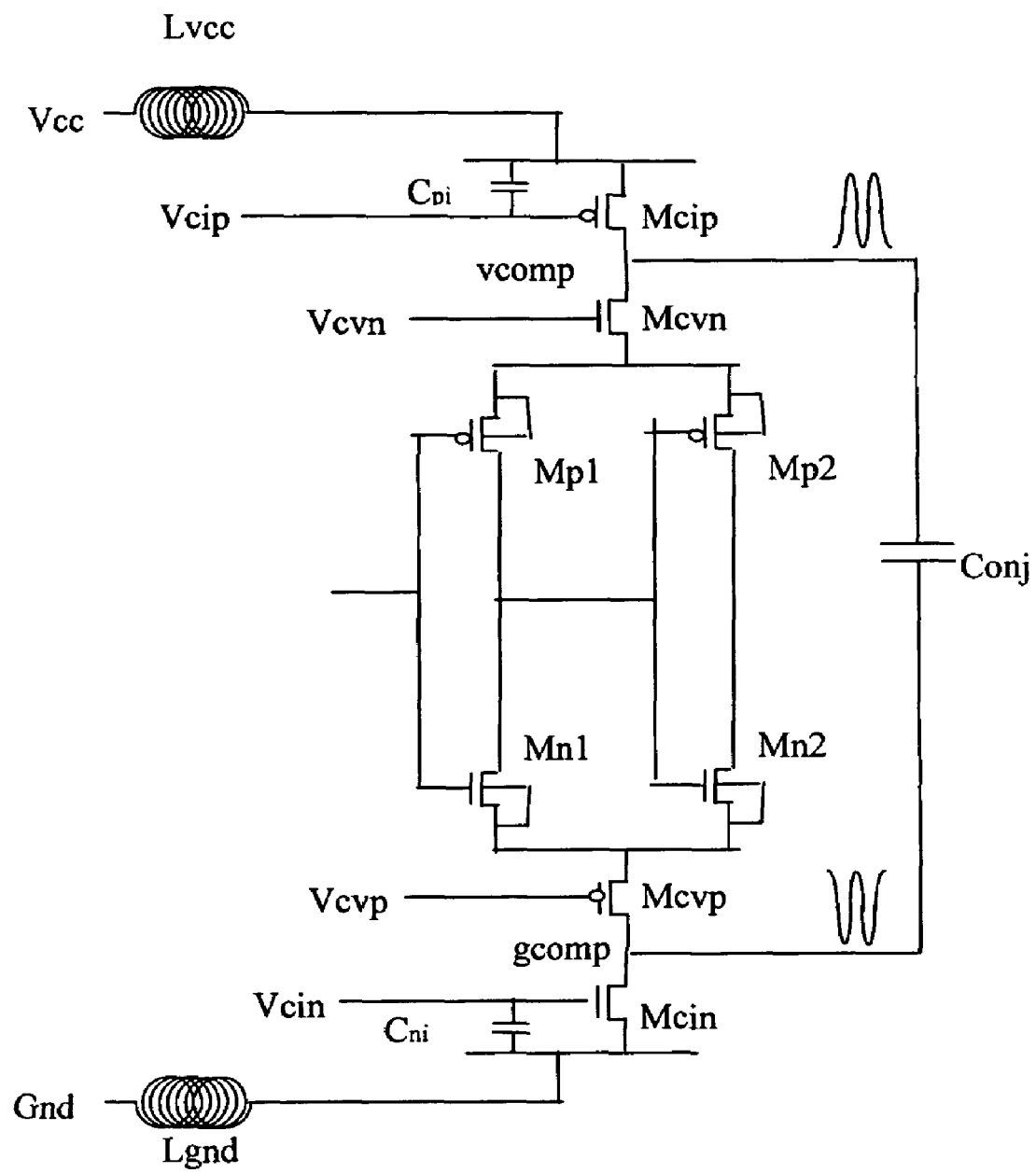
Figure 12D:
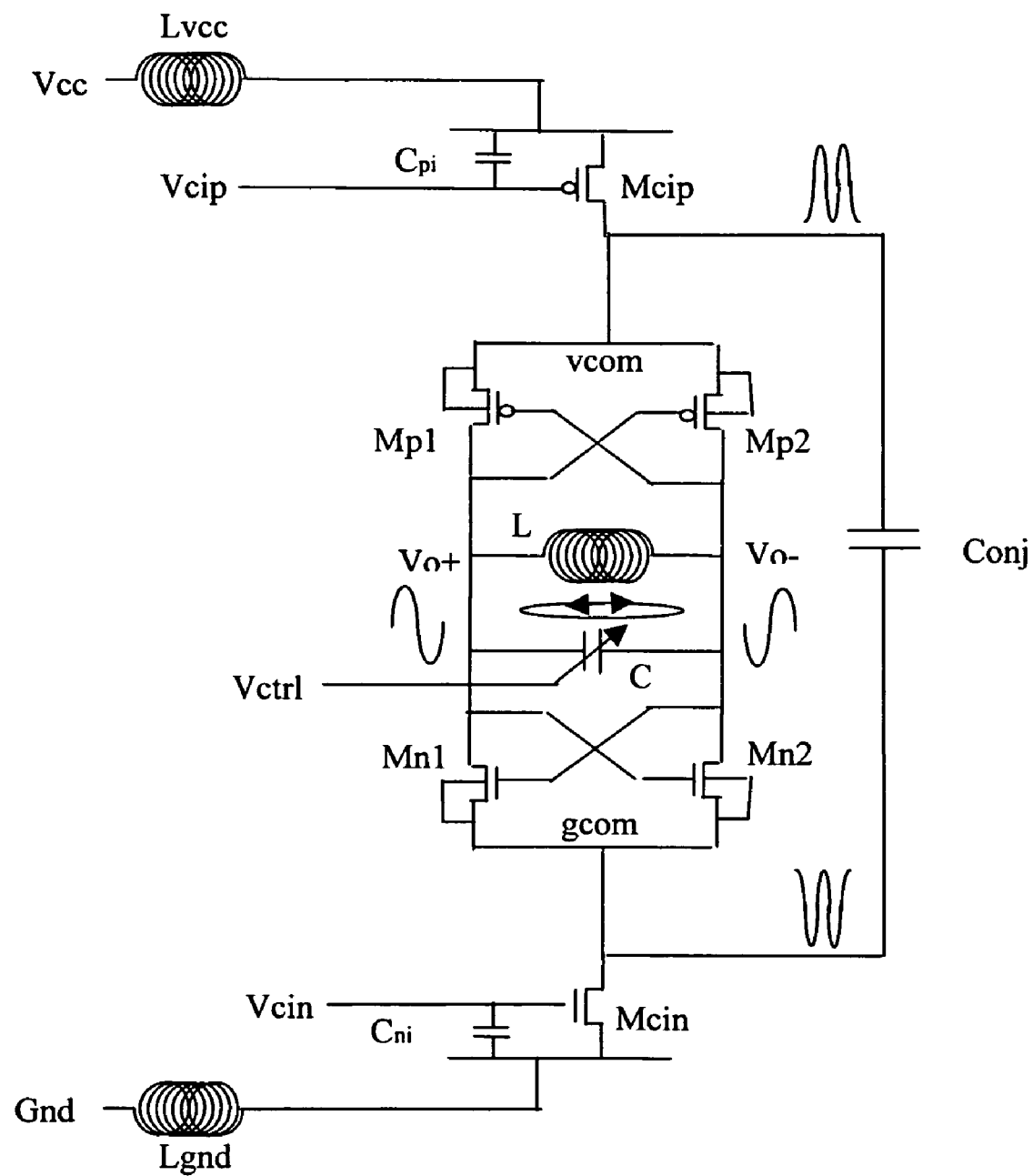

As shown in FIG. 12C, the LCO tank is replaced with the digital logic circuit. The digital circuit shares the same distributed LDVR as LCO tank does. So the LCO and digital circuit have the mechanism is similar to the nuclear core of the artificial sun. The noise generated by the LCO and digital circuit are isolated from each other. This is the power plan and noise plan for the RF SOC design in the XTALCLKCHIP (Trademark for a chip equivalent to a clock chip and including means equivalent to a crystal resonator). The clamping devices $M_{cvn}$ and $M_{cvp}$ are to isolate the noise from the LCO. However, they need have bias circuit. They can save to simplify the circuit. FIG. 12D is the simplified version of FIG. 12A. The clamping devices voltage source $M_{cvn}$ and $M_{cvp}$ are saved without much impact on the performance to simplify the circuit complexity.

Figure 13A:
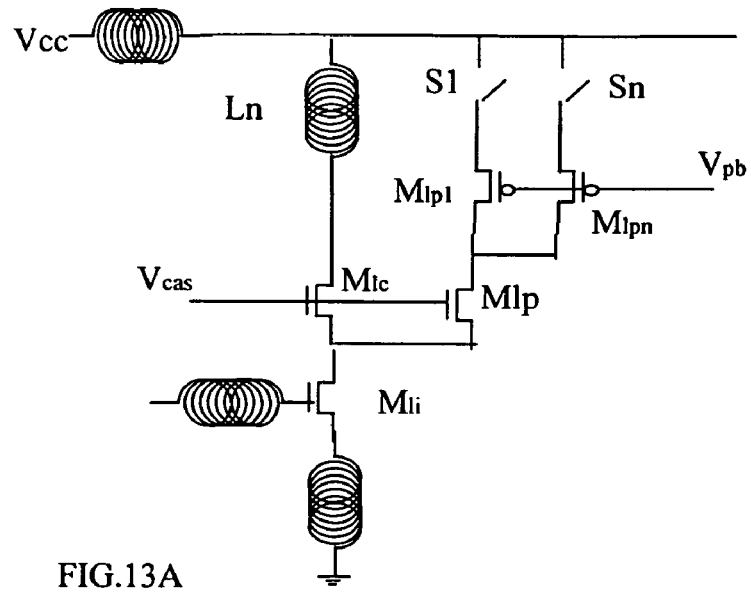
Figure 13B:
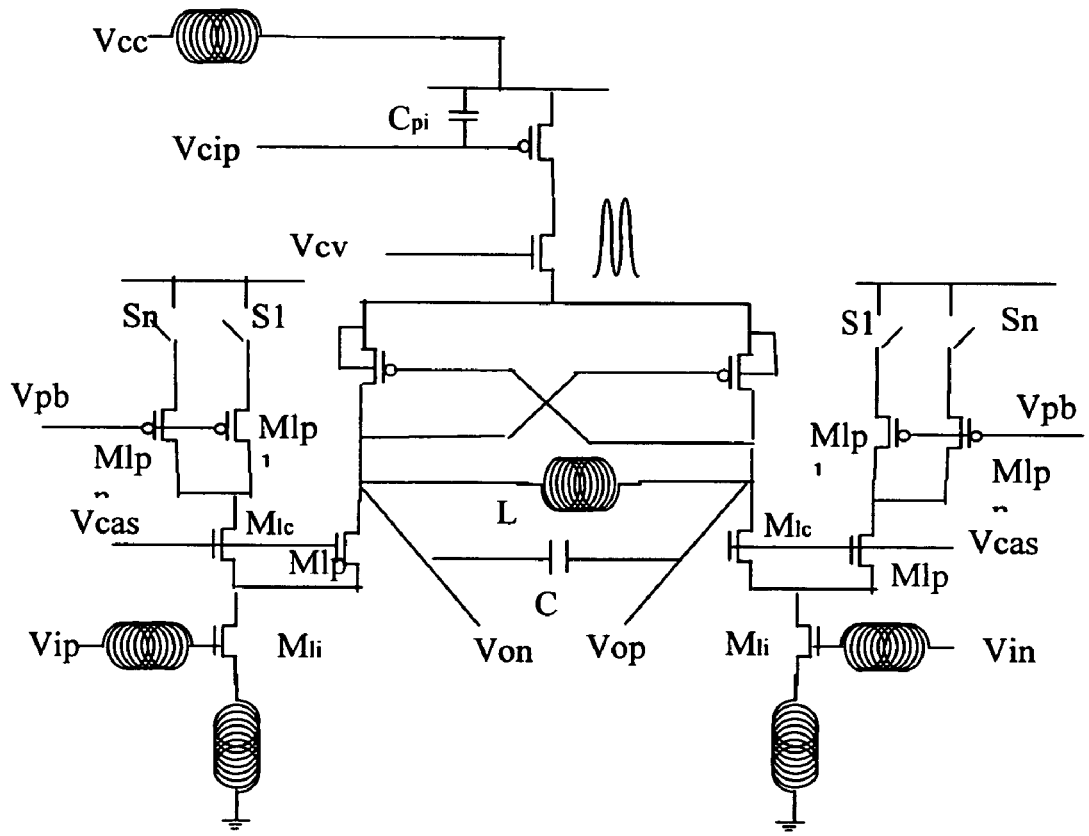

Since the XTALCLKCHIP (Trademark for a chip equivalent to a clock chip and including means equivalent to a crystal resonator) may have the high frequency clock direct interface, so the XTALCLKCHIP (Trademark for a chip equivalent to a clock chip and including means equivalent to a crystal resonator) have the programmable LNA (PLNA) as shown in FIG. 13. FIG. 13A is the basic single end circuit configuration of LNA. FIG. 13B is the hierarchical design noise style for differential end PGLNA design. The circuit configuration is to have the output active inductor load lying horizontally. The current and energy are circulating horizontally in the circuit instead of the vertically pumping on the power supply and ground. It reduces the chip noises.

As shown in FIG. 13A, for the impedance matching, the PLNA must have the constant impedance. So the current flows through the input device $M_{1i}$ must keep constant. We can adjust the current flowing through the load $L_n$ to adjust gain of PLNA. The switch $S_1$, Sn are the programmable switch to adjust the DC current injecting into the $M_{1i}$. The more DC current injecting into $M_{1i}$, the less gain of PLNA will be.

As shown in FIG. 14 is the filtering mixer which combines the mixer and filter function together. It saves the energy, layout area and reducing the noise. The input signal $V_{i1p}$ and $V_{i1n}$ oscillate at frequency $f_1$. The input signal oscillates at frequency $f_2$. The LC tank oscillates at the $f_1-f_2$. So, in FIG. 14, the bottom portion is the traditional mixer, the upper portion is the LCO oscillator serving as the filter. As $f_1$ signal mixes with $f_2$ signal, two different frequencies signals will generate. The LCO filter will filter out the ($f_1+f_2$) signal and amplifying the ($f_1-f_2$) signal only.

FIG. 15 shows the power amplifier or the on-chip buffer having the LC tank energy circulating horizontally. The bottom is a differential input. The upper portion is the LC oscillator tank. We use the LC tank to pull and push the heavy out load. In this circuit configuration, the driving energy just circulates around and reusable. The energy doesn't flow into the ground and impact on the ground to make giant noise. It saves a lot of energy and reduces a lot of noise.

FIG. 16 shows the direct analog temperature compensation for the LC tank as shown in FIG. 1. Instead of going through the A/D, table, DAC or digital control path, the temperature sensor circuit makes the temperature compensation directly as the analog signal processor. FIG. 16B shows the principle of the temperature compensation. FIG. 16A is the implementation of the temperature compensation circuit. The inductor varies as the temperature changes. The temperature sensor circuit senses the variance of the temperature and varies the $V_{ctrl}$ signal to vary the capacitance. The variance of inductance is compensated with the variance of capacitance to have the output clock frequency $f_o$ to be constant. The gain of the variance of capacitance can be adjusted with the variance of R.

Figure 17A:
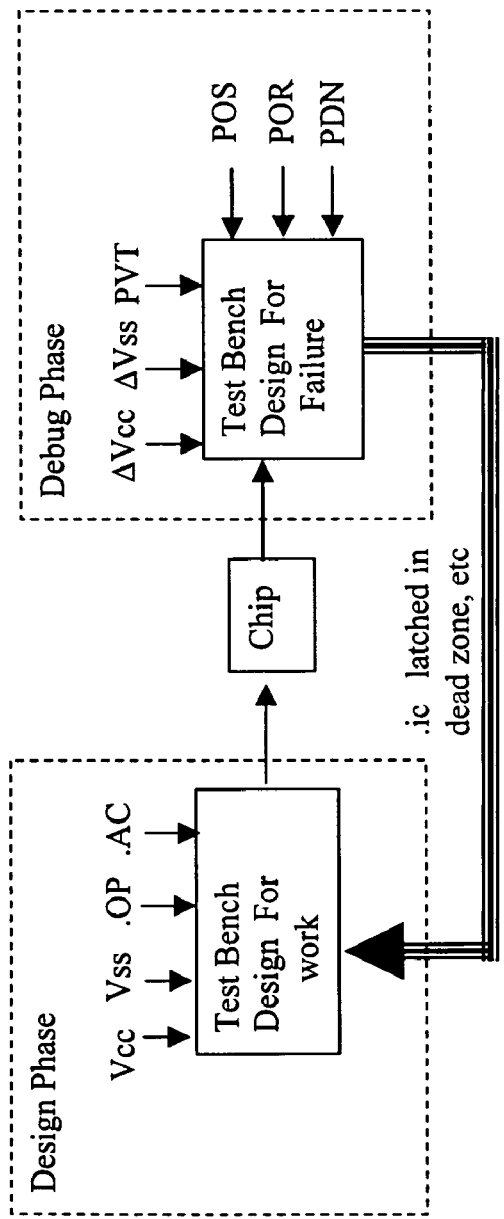
Figure 17B:
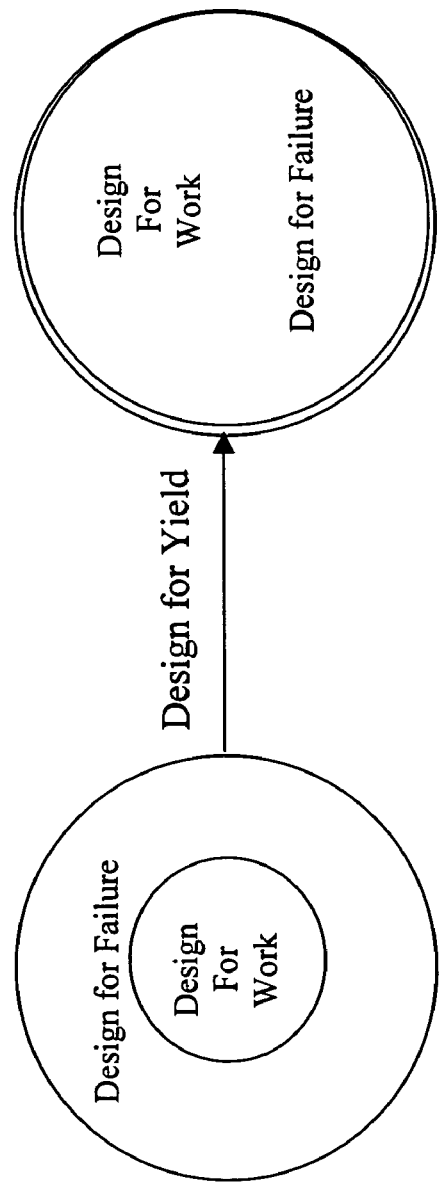
Figure 18D:
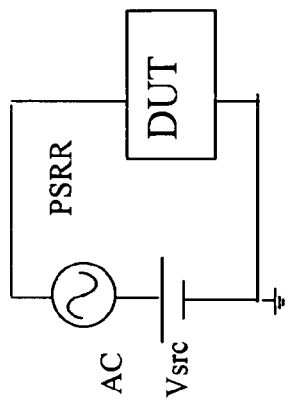
Figure 18E:
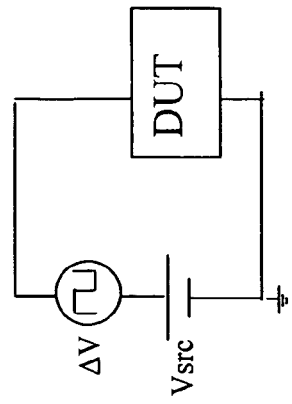
Figure 18A:
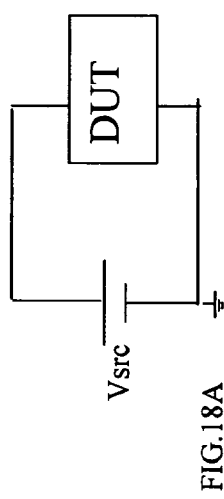
Figure 18B:
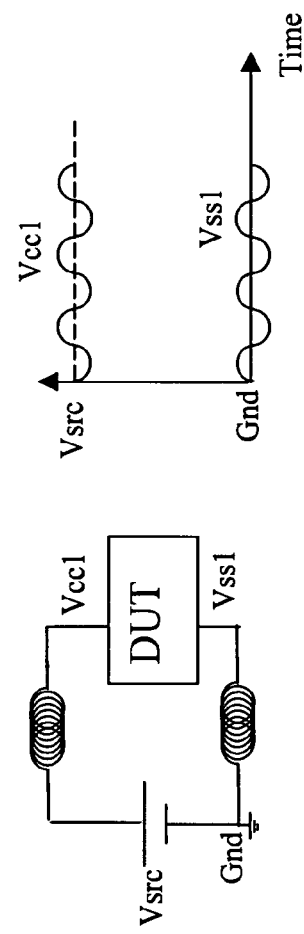
Figure 18C:
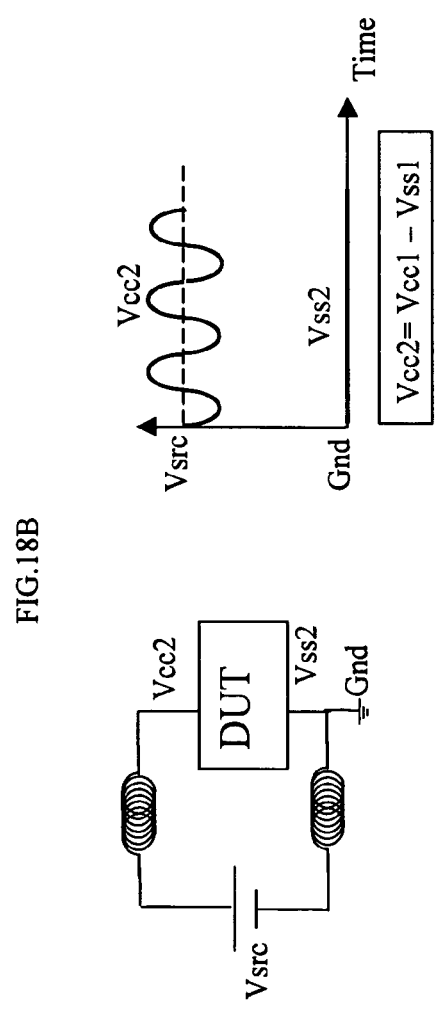

As show in FIG. 17A, today analog design is based on the solid power and ground bus to calculate the operating point (OP) and do AC analysis at this operating point. However, in the real chip case, there are a lot of noises on the power bus and ground bus. The process, voltage, temperature (PVT) variation causes the CMOS devices of the analog circuit having the out of saturation mal-function cases. The power-on-sequence (POS), power-on-reset (POR) and power-down to save energy, all the processes are the dynamic transient process. The circuit might be locked in the dead zone state and the circuit cannot reach the normal operating point. It causes the yield problem. This is one of the failure modes in the debug phase. As shown in FIG. 17B, the design for yield (DFY) is to consider both the design phase performance issue and debug phase failure issues to be a unified design platform.

FIG. 18 shows the evolution of the DFY design methodology. Today analog design still adopts the solid power and ground buses as shown in FIG. 18A. In the real chip, the chip has the bonding wires for the power buses. There are oscillation on the power bus and ground bus as shown in FIG. 18B. To simplify the analysis and simulation, the ground node is moved from the negative pole as shown in FIG. 18B to the pin of the ground bus as shown in FIG. 18C. Now the ground bus is static zero having no oscillation. However, the power bus has almost double the oscillation amplitude. The relative power bus oscillation is $V_{cc2}=V_{cc1}-V_{ss1}$. The oscillation of $V_{ss1}$ is 180 degrees out phase of $V_{cc1}$ and the amplitude of $V_{ss1}$ is about the same order of $V_{cc1}$. So the amplitude of $V_{cc2}$ is about twice of $V_{cc1}$. With the wave being shown in FIG. 18C, so the AC analytic model of the DFY is shown in FIG. 18D and the transient analytic model of the DFY is shown in FIG. 18E. The $\Delta V$ is about 200 mV.

The DFY design flow is shown in FIG. 19. The system integration engineer needs to develop the SOC infrastructure to prevent the digital noise from leaking out to the board to pass the whole-board performance verification test. In the analog/mixed signal/RF design, we not only design for the AC at OP, but also design for the PSRR and $\Delta V$.

The DFY has one platform for the SOC chip. The idealized DFY platform is shown as FIG. 20A. There are two layers for the power and ground bus to isolate noise. From the outside $V_{cc}$ and $G_{nd}$ to see the upper power layer and the bottom ground layer, going through the bonding wire, there are idealized current source $I_{src}$. From the inside of the internal circuit to see the upper power layer and the bottom ground layer, there is an idealized voltage source $V_{src}$. As shown in FIG. 20, the idealized MOS device is modeled as voltage source $V_{GS}$ in and idealized current source IDS out. As shown in FIG. 20D, the ideal DFY chip model is modeled as idealized current source $I_{VCC}$ in and idealized voltage source $V_{PWR}$ out.

Figures 20A, 20B:
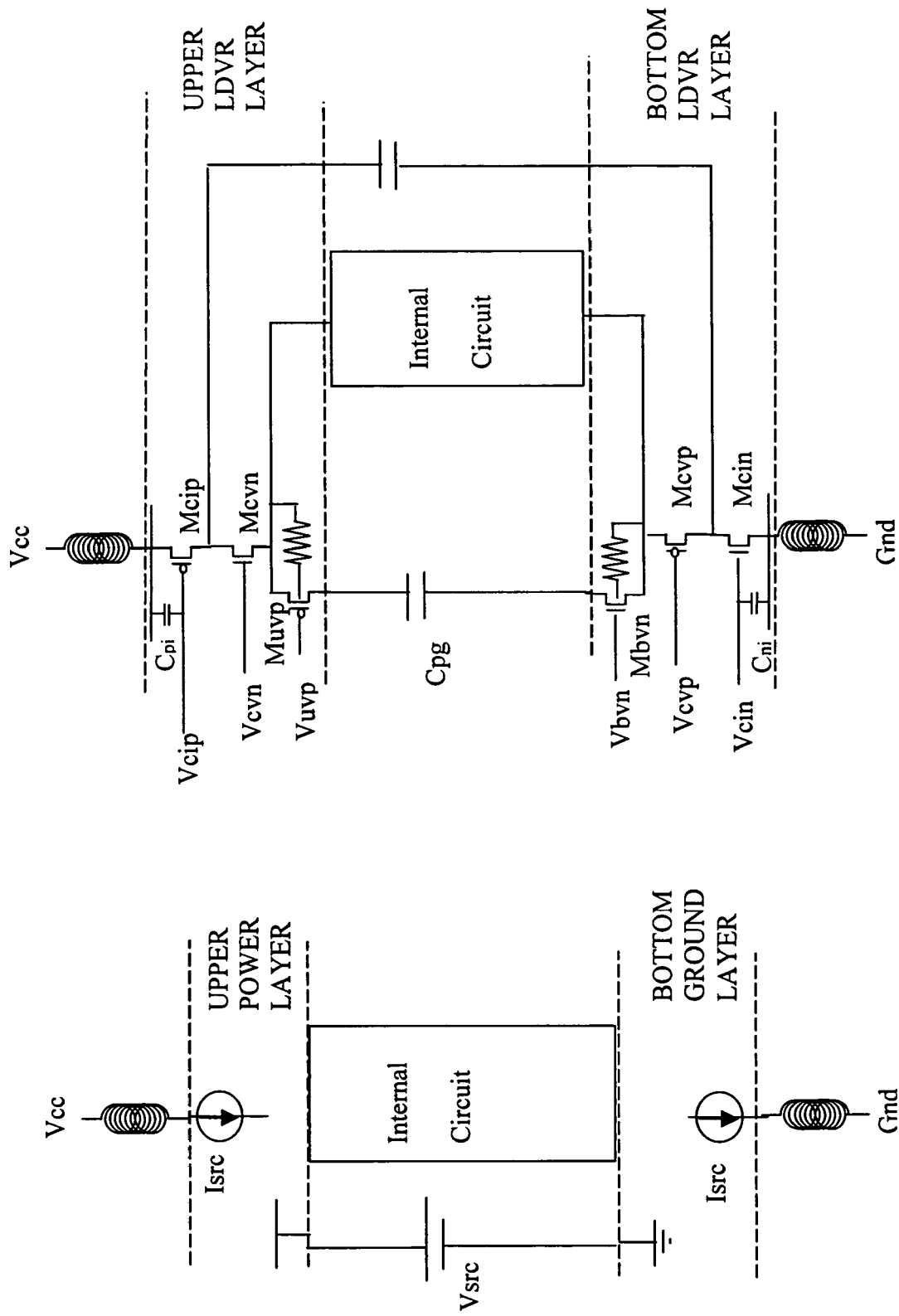
Figure 20D:
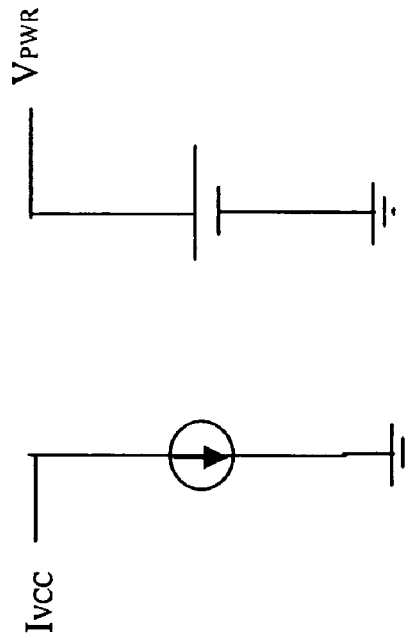
Figure 20C:
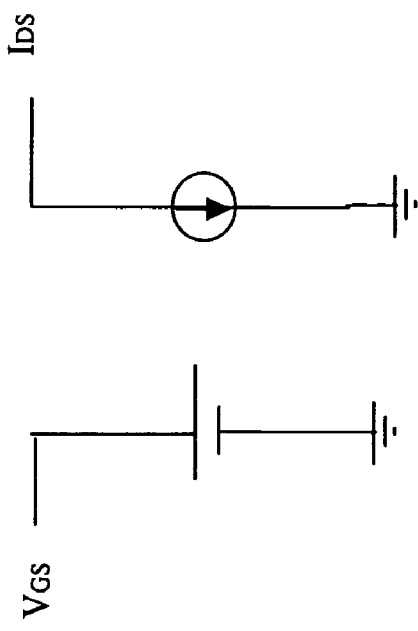

The idealized DFY platform is implemented as FIG. 20B. The $M_{cip}$ and $M_{cin}$ devices serve as the idealized current source $I_{src}$. The $M_{cvn}$ and $M_{cvp}$ devices serve as the idealized voltage source $V_{src}$. The capacitor $C_{pi}$ and $C_{ni}$ serve both compensation capacitor and the power and ground buses noises reducing capacitor. The capacitor ratio between $C_{pi}$ and $M_{cip}$ is about 100:1. The capacitor ratio between $C_{ni}$ and $M_{cin}$ is about 100:1. The $M_{uvp}$ and $M_{bvp}$ devices are the active clamping devices for the idealized voltage source $V_{src}$. $C_{pg}$ is equivalent to the voltage clamping capacitor between the power and ground source.

Figure 20G:
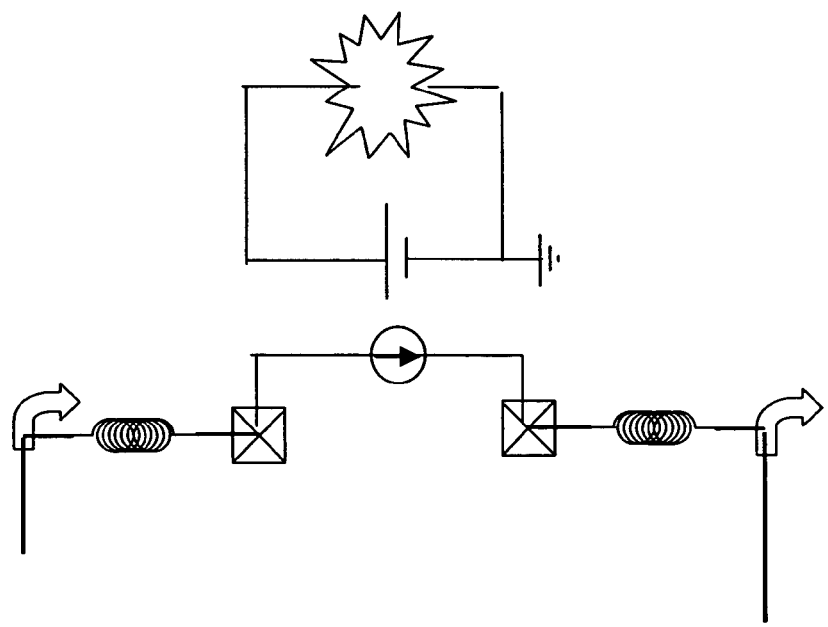
Figure 20F:
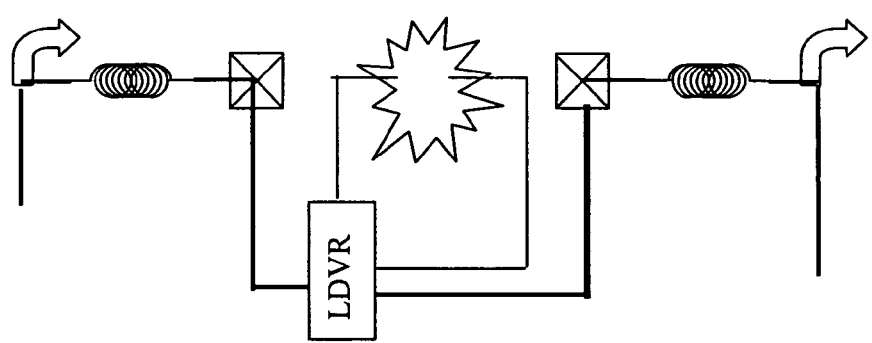
Figure 20E:
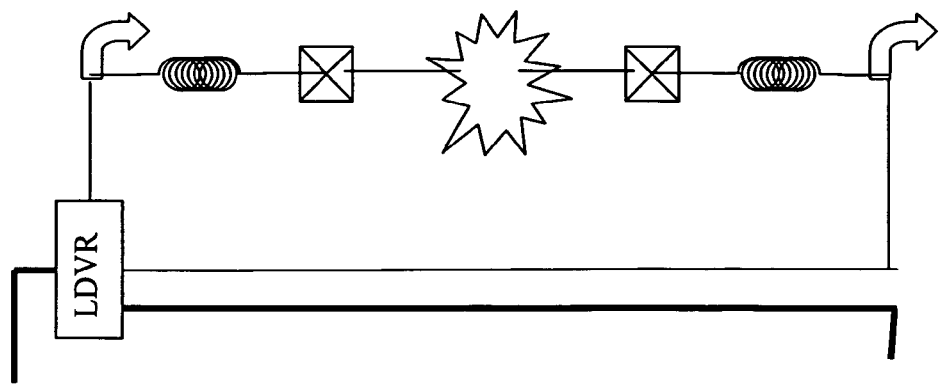

The DFY chip platform is implemented with the on-chip low drop voltage regulator (LDVR). The on-board LDVR is shown as FIG. 20E. The LDVR on board cannot get rid of the chip noise. To get rid of the chip noise generated by the bonding wires, the on-chip LDVR is adopted as shown in FIG. 20F. The on-chip LDVR can be modeled to be idealized DFY platform as shown in FIG. 20G. For the distributed LDVR, the biasing current generator is moved from analog circuit to LDVR and combining with the LDFR.

Figure 21A:
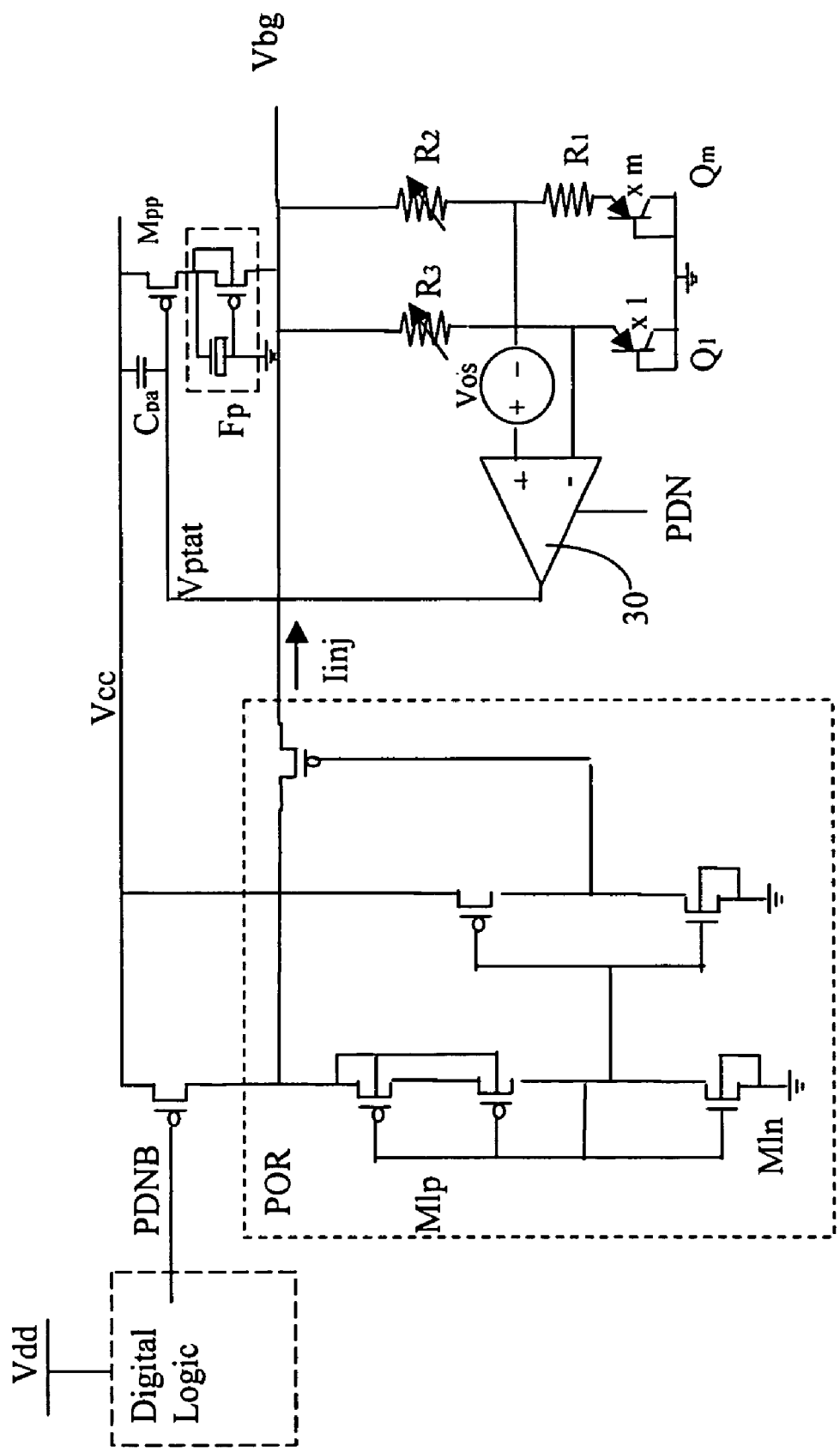
Figure 21B:
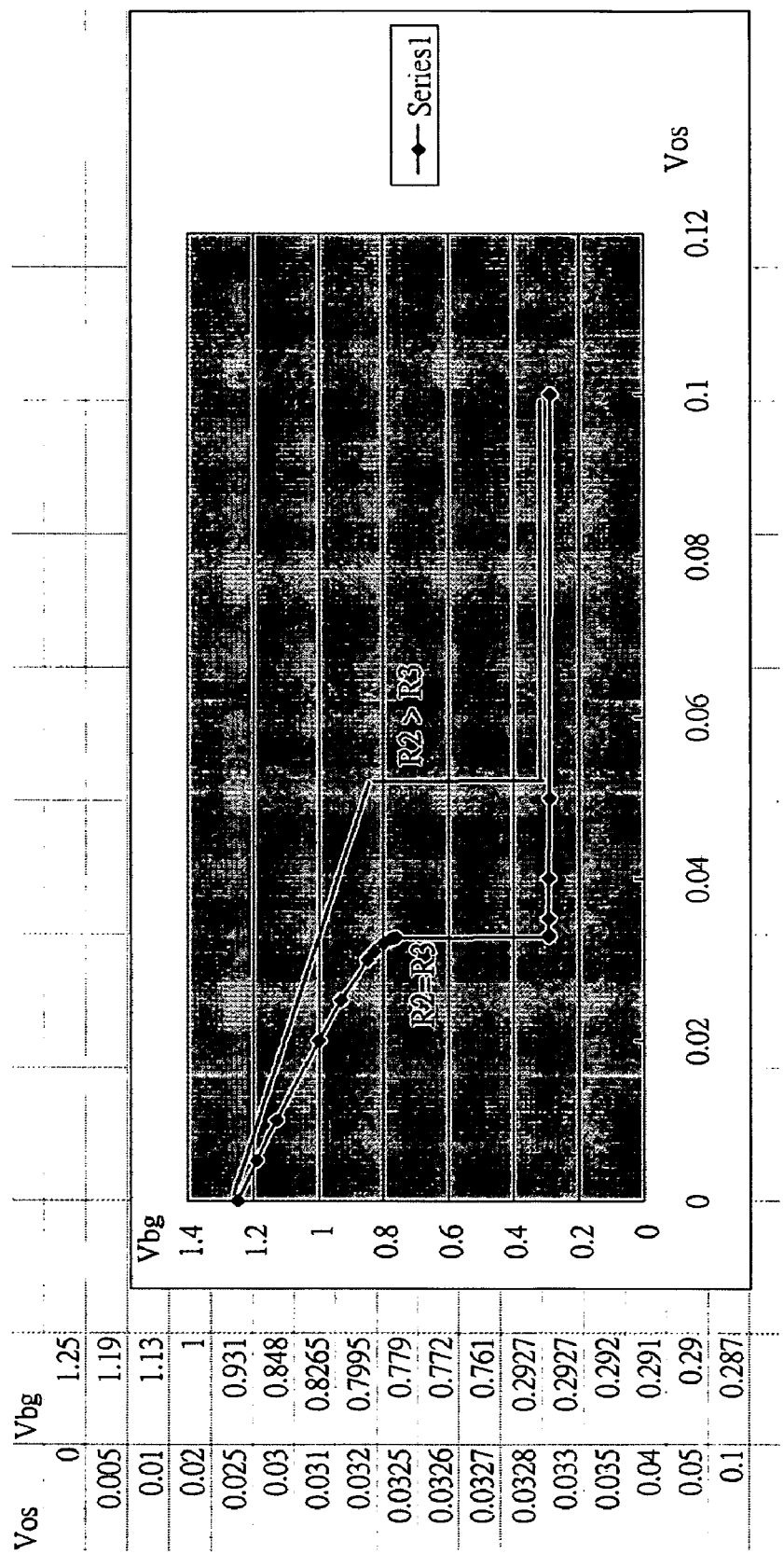

The DFY platform needs the LDVR. For PVT (process, voltage, temperature variance independent) design process, LDVR needs the bandgap voltage $V_{bg}$. For the multiple power buses DFY platform, the bandgap voltage generator is shown as FIG. 21A. The bandgap voltage generator in the SOC has the multiple power buses effect. It must survive in the POS (power-on-sequence), POR (power-on-reset), PDN (power-down), and etc versatile start-up environment. Even worse, as shown in FIG. 21B, the offset voltage $V_{os}$ easily fails the bandgap voltage with 30 mV offset. How to design a reliable bandgap voltage reference generator becomes the challenging work. As shown in FIG. 21A, the power bus $V_{dd}$ and $V_{cc}$ can have any power on sequence. The power down signal PDN and PDNB have different POS relations with the $V_{cc}$ and the bandgap voltage generator. As the $V_{cc}$ starts earlier, the bandgap voltage is locked in the dead zone due to the minor $V_{os}$, says +2 mV. The bandgap voltage generator cannot be kicked to start with the traditional pulling down Vptat voltage. So, we have the POR circuit to inject the start pulsing current $I_{inj}$ directly into the bandgap mechanism made of $R_1$, $R_2$, $R_3$, $Q_1$ and $Q_m$. Furthermore, to reduce the impact of $V_{os}$, $R_3<R_2$.

Figure 22A:
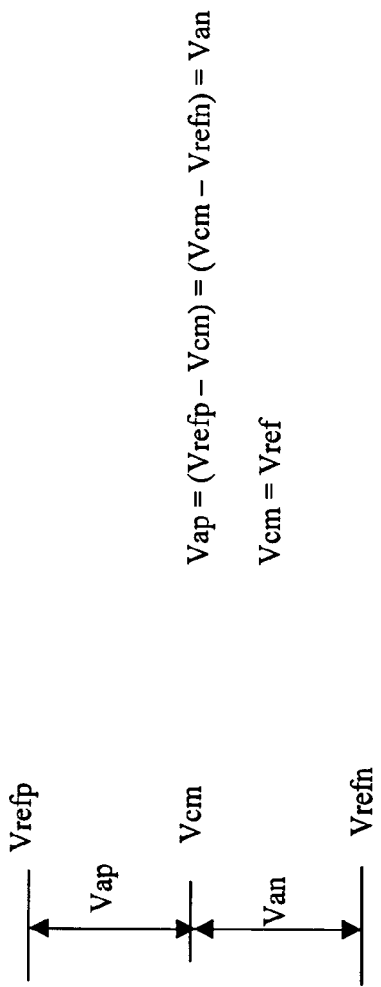
Figure 23A:
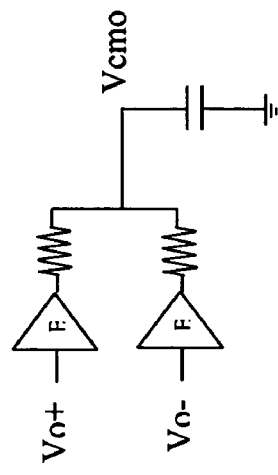
Figure 23D:
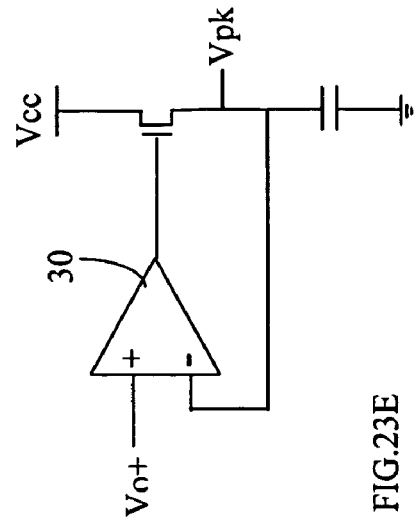
Figure 23B:
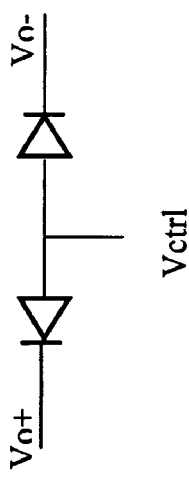

For SOC having both analog and digital circuit, we need to convert the analog signal to be the digital signal with ADC. The ADC must have two accurate references: reference voltage $V_{refp}$, $V_{refn}$ and clock reference. As shown in FIG. 22A is the static reference voltage. As shown in FIG. 23B is the dynamic reference. These references are derived from the bandgap reference.

As shown in FIG. 22A, for the reference voltage generator, $V_{refp}=V_{cm}+I_{ref}\times R_u$ $V_{refn}=V_{cm}-I_{ref}\times R_L$ $V_{ap}=V_{refp}-V_{cm}=V_{cm}-V_{refn}=V_{an}$ Where $R_u=R_L$.

Figure 22B:
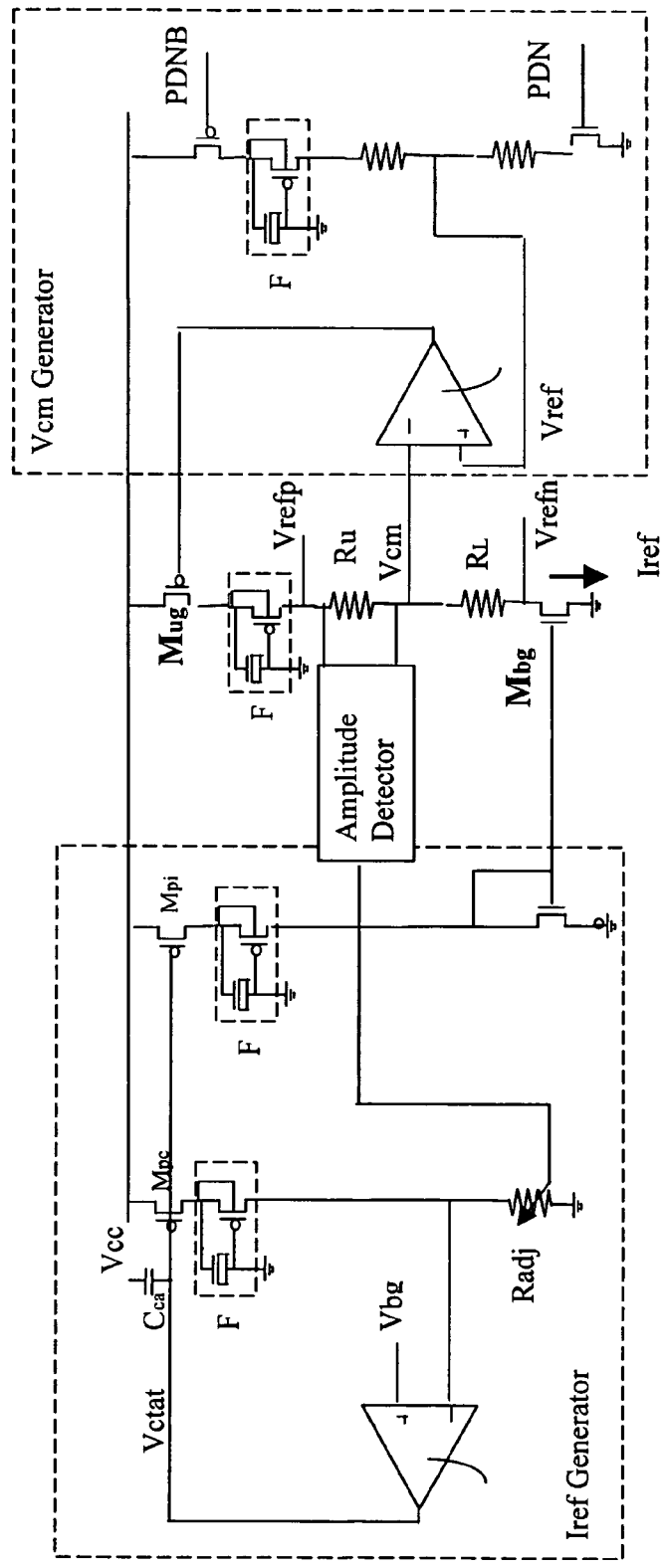

The $V_{cm}$ is usually selected to be the middle point of the power supply voltage, i.e., $V_{cm}=(1/2)V_{cc}$. As shown in FIG. 22B, the voltage reference generator is to generate the voltage reference according to the above relation. The $I_{ref}$ generator generates the $I_{ref}$ from the bandgap voltage $V_{bg}$. The $I_{ref}$ generator generates the control-biasing signal to the current source device $M_{bg}$. The $V_{cm}$ generator generates $V_{ref}=(1/2)V_{cc}$ from $V_{cc}$ and adjust the $V_{cm}=V_{ref}=(1/2)V_{cc}$. The $V_{cm}$ generator generates the control-biasing signal to the current source device Mug. The $V_{cm}$ generator adjust the current source device Mug to have the voltage $V_{cm}=V_{ref}$, the $I_{ref}$ generator is to adjust the voltages to have the specified voltage ranges $V_{ap}$ and $V_{an}$, This is a static case. FIG. 23 shows the same circuit topology applying to the dynamic case of the clock generator.

Figure 23E:
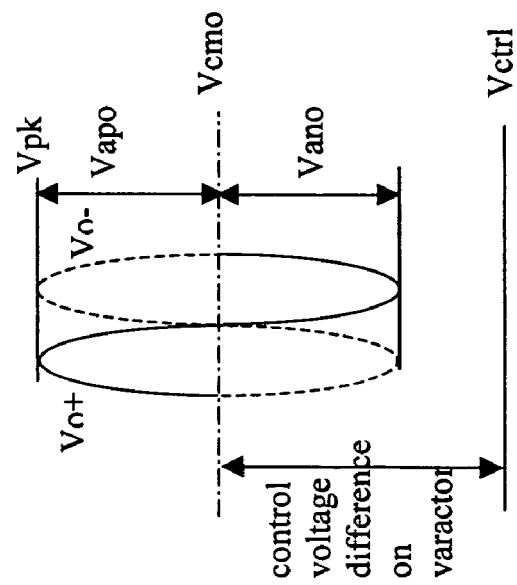
Figure 23C:
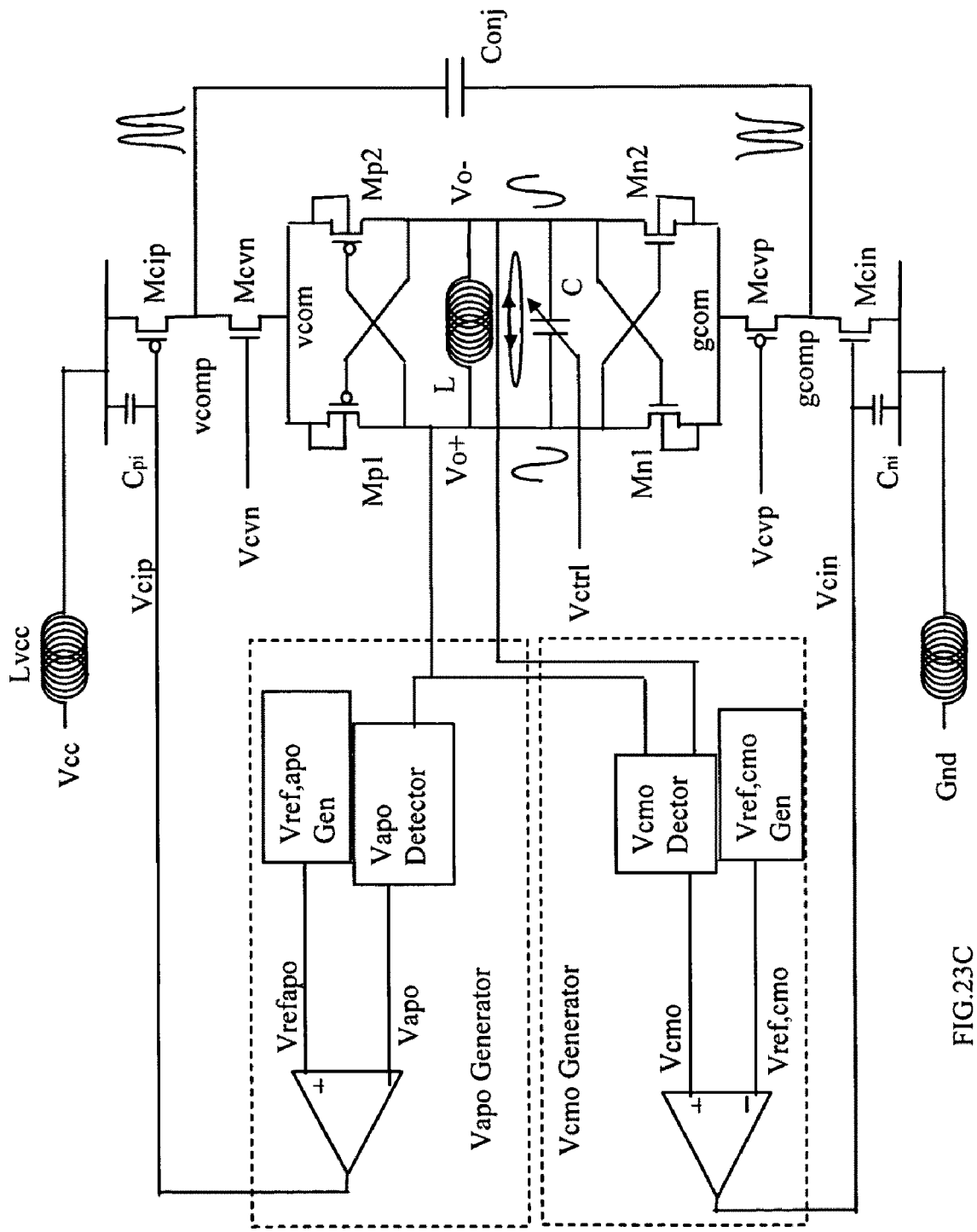

As shown in FIG. 23C is the LC resonator of the clock generator. The oscillation frequency is determined by the square root of (1/LC). To adjust the oscillation frequency, the $V_{ctrl}$ is applied to bias the varactor to change the capacitance of the varactor. The capacitance of the varactor is varying due to the voltage difference across the varactor. However, as shown in FIG. 23A and FIG. 23B, this is a dynamic process. The capacitance of the varactor is a nonlinear function of the voltage difference crossing the varactor. Even $V_{cmo}$ and $V_{ctrl}$ keep the same, varying the oscillation amplitude $V_{apo}$ and $V_{ano}$, the capacitance of varactor is varying. It causes the oscillation frequency shifts accordingly. So, we need make control of both the oscillation common mode voltage level $V_{cmo}$ and the oscillation amplitude $V_{apo}$ and $V_{ano}$ to be the specified design value. Being similar to FIG. 22, we apply the $V_{cin}$ control signal to the current device $M_{cin}$ to control the oscillation amplitude $V_{apo}$ and $V_{ano}$. We apply the $V_{cip}$ signal to the current device $M_{cip}$ to control the common mode voltage $V_{cmo}$. This is the dynamic case.

As shown in FIG. 23C, the $V_{ref,cmo}$ generator generates a $V_{refcmo}$. As shown in FIG. 23D, the $V_{cmo}$ detector detects the $V_{cmo}$. The $V_{cmo}$ Generator compares the $V_{cmo}$ and $V_{refcmo}$ and applies the $V_{cip}$ signal to adjust the common $V_{cmo}$ level of $V_{o+}$ and $V_{o-}$. The $V_{ref,apo}$ generator generates the reference peak voltage $V_{refapo}$. As shown in FIG. 23E, the $V_{apo}$ detector detects the peak amplitude voltage of the $V_{o+}$. The $V_{apo}$ generator compares the $V_{refapo}$ with $V_{apo}$ and applies the biasing signal $V_{cin}$ to control the current device $M_{cin}$ to adjust the amplitude of $V_{o+}$ and $V_{o-}$. Furthermore, the $V_{apo}$ generator has the kick to start function. At the starting point, the oscillation amplitude $V_{o+}$ and $V_{o-}$ is small. The $V_{apo}$ generator will inject a large current into the LCO oscillation tank to kick the LCO oscillator to oscillate.

It is noted that the $V_{cmo}$ in FIG. 23D connected to be the $V_{ref}$ in FIG. 23B, then the $V_{refp}$ becomes the voltage $V_{refapo}$ in FIG. 23C. In other words, the $V_{refapo}$ Gen in FIG. 23C can be implemented with the $V_{ref}$ Generator circuit with proper modifications. The $R_{adj}$ and $R_u$ have the temperature compensation with each other. So, the $V_{refp}$ and $V_{refapo}$ are constant over temperature.

Figure 23F:
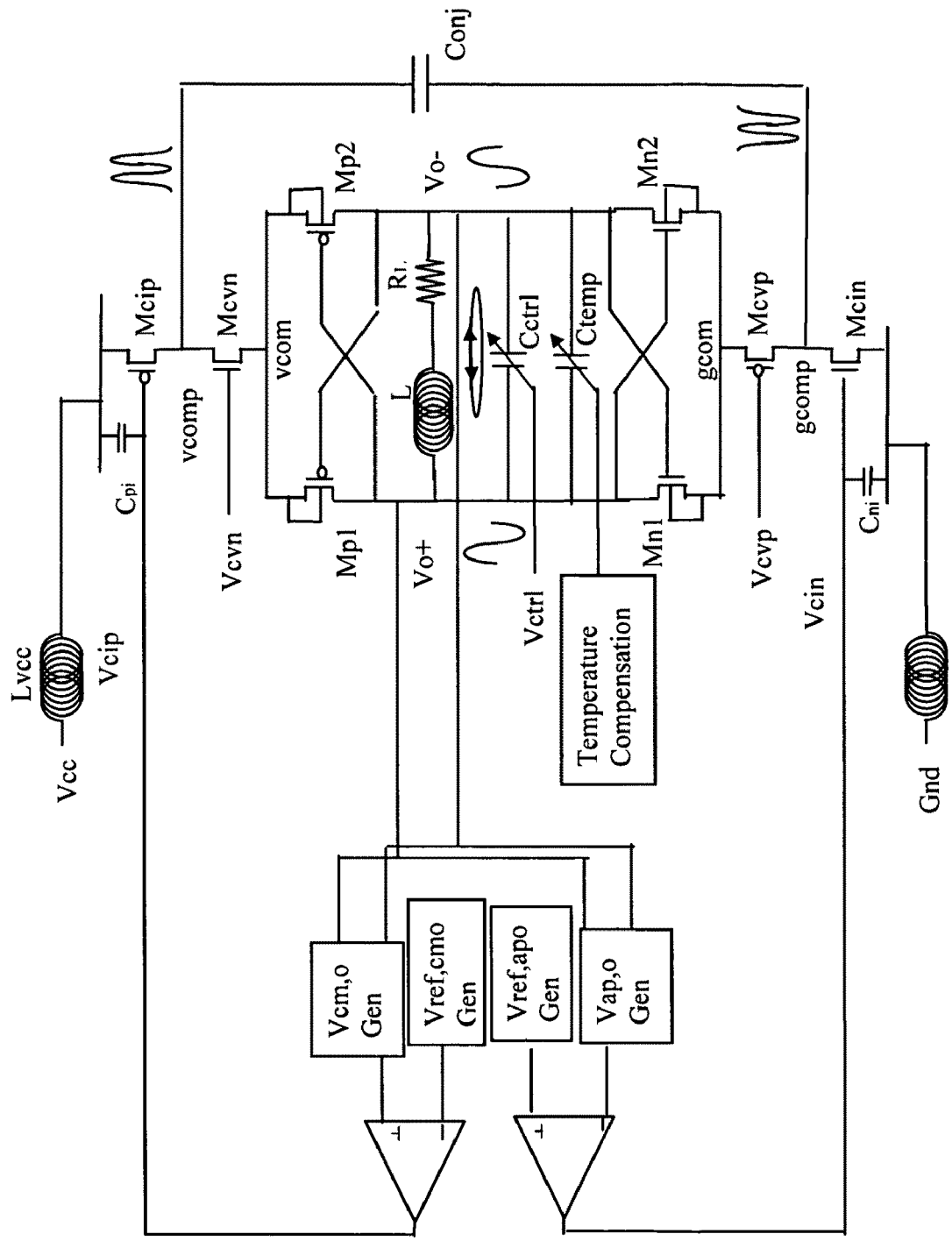
Figure 23H:
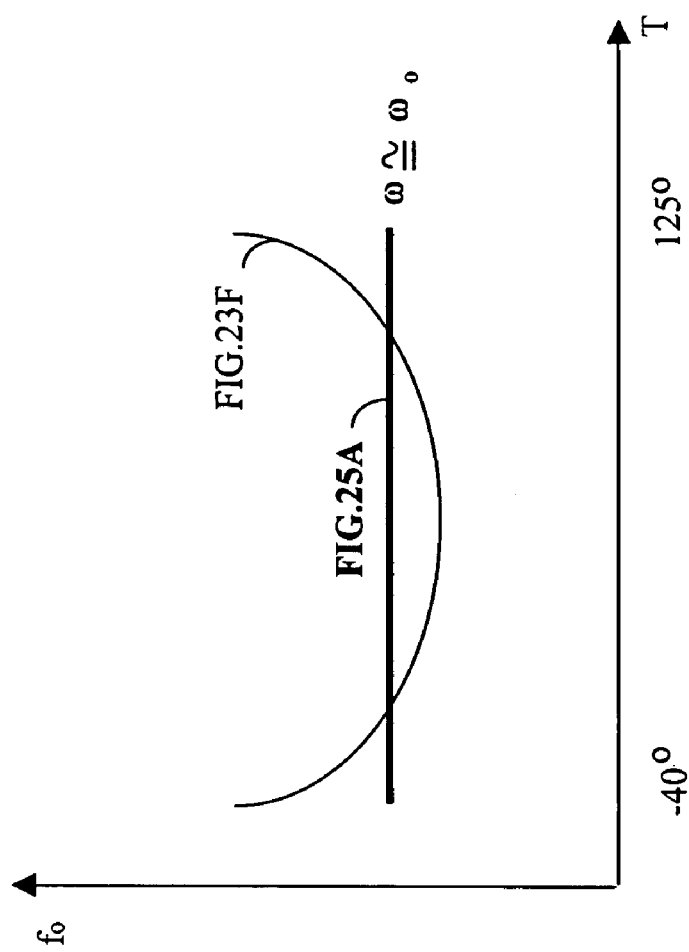
Figure 23G:
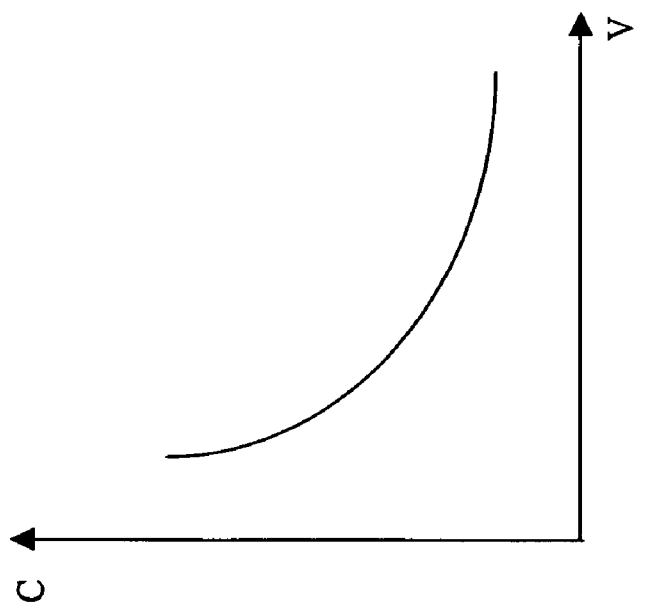
Figure 25A:
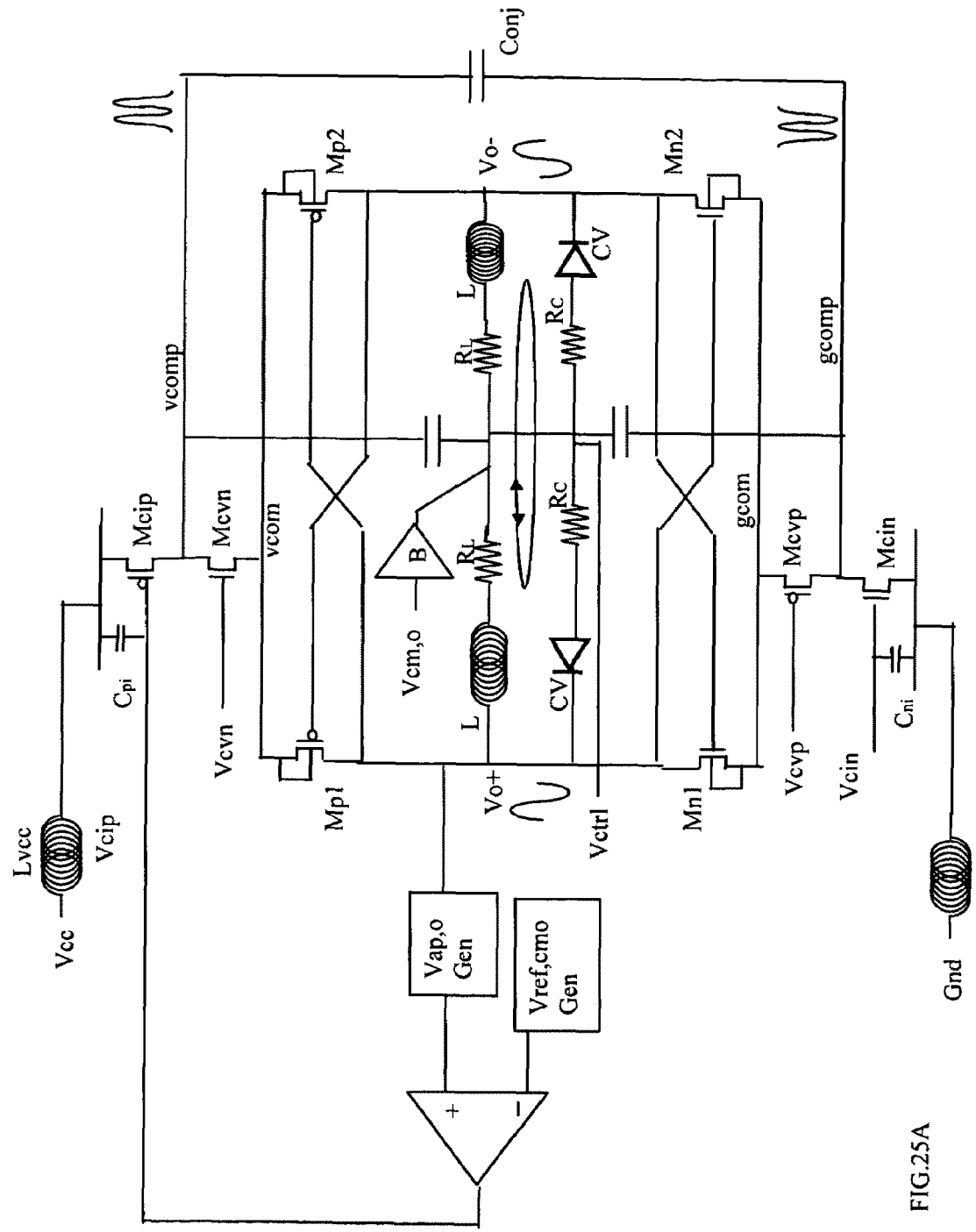

However, the inductor has the parametric resistance $R_L$. The resistance $R_L$ varies according to temperature. So, it needs the temperature compensation array to adjust the capacitor value to adapt the variance of the frequency due to the variance of the parametric inductor resistance as shown in FIG. 23F. However, due to the nonlinearity of the varactor as shown in FIG. 23G, the best compensation result for the temperature compensation capacitor array methodology is the "smiling curve" as shown in FIG. 23H. So, we have the other resistor-resistor compensation as shown in FIG. 25A. It is not only to save the complexity of the chip to reduce the price of the chip but also to enhance the performance.

The $V_{cmo}$ can be injected into the LCO tank to specify the common mode voltage $V_{cmo}$ to be specified voltage. Level. As shown in FIG. 24, the inductor is separated to be two equal inductors $L_1$ and $L_2$. An analog buffer $B_a$ is adopted to specify the middle voltage $V_{co}$ to be $V_{cmo}$. The analog buffer can be a unit gains OPAMP. So, we need only have the $V_{apo}$ generator to control the current device $M_{cip}$ to adjust the amplitude of the oscillation.

It is noted that the common mode voltage injecting method can only applied to the LCO case as shown in FIG. 24, The common mode voltage injecting method cannot be applied to the $V_{ref}$ generator case as shown in FIG. 22.

To compensate the frequency variance, the smart way is adopted as shown in FIG. 25A. There are compensating resistances $R_C$ being added in series with the capacitor of varactor. The compensate resistance $R_C$ is equal to the parametric resistance $R_L$. The compensation resistance $R_C$ working principles are derived as follows.

Figure 25C:
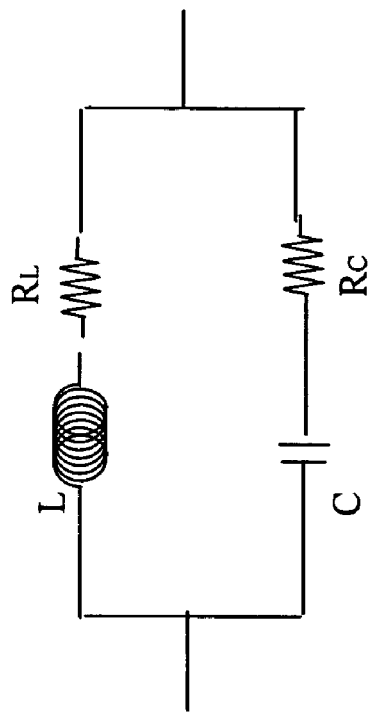
Figure 25B:
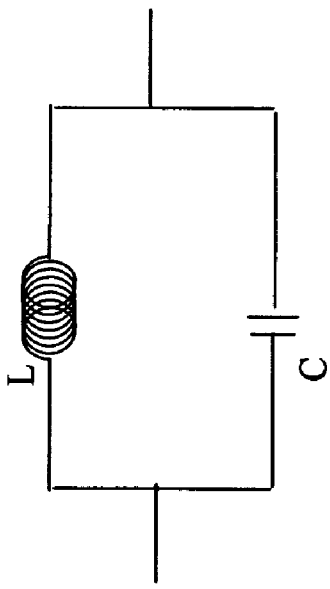

As shown in FIG. 25B, $$Y(j\omega) = \frac{1}{j\omega L} + j\omega C$$

$$d(Y(j\omega))/d(j\omega) = 0$$

$$\frac{1}{-\omega^2 L} + C = 0$$

$$\omega_0 = \sqrt{\frac{1}{LC}}$$

As shown in FIG. 25C, $$Y(j\omega) = \frac{1}{j\omega L + R_L} + \frac{1}{\frac{1}{j\omega C} + R_C}$$

$$d(Y(j\omega))/d(j\omega) = 0$$

-continued $$\omega = \omega_0 \frac{j\omega L + R_L}{\frac{1}{j\omega C} + R_C}$$

$$\cong \omega_0 \frac{j\sqrt{\frac{L}{C}} + R_L}{j\sqrt{\frac{L}{C}} + R_C}$$

If $R_C = R_L$ $\omega \cong \omega_0$

As shown in FIG. 23F, to compensate the variance of the oscillation frequency of the LCO induced by the parametric resistance $R_L$ of inductor, the temperature compensation circuit is needed to fine-tune the capacitance of the second varactor. It wastes a lot of the chip resource.

Figure 25D:
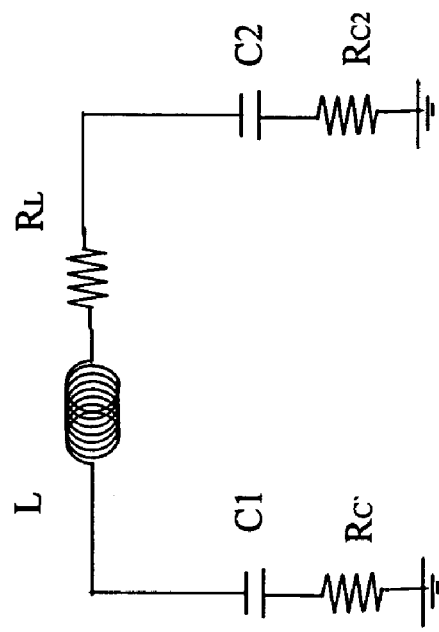

As shown in FIG. 25B, applying the relation of $d(Y(j\omega)/d(j\omega)=0$, the ideal LCO tank with no resistance has the oscillation frequency to be $\omega_o$ to be square root of (1/LC). As shown in FIG. 25C, we use the temperature variance of resistance to compensate the temperature variance of resistance. The frequency variance induced by the parametric resistance $R_L$ is small, the variance of oscillation frequency is small. So we can apply the approximation to simplify the derivation in the second order relation. Finally, we get, for the first order compensation, as long as $R_C=R_L$, the $\omega$ can be keep constant $\omega_o$. FIG. 25D is the general configuration of the LCO tank. The same argument and conclusion made in FIG. 25C can be extended to the general configuration of the LCO tank as shown in FIG. 25D.

As shown in FIG. 24B, there is a current mirror version of the current sources. In such case the injecting current of $V_{cmo}$ injecting into the $V_{co}$ node is almost zero. In the enhanced version of the LCO tank will save a lot of power.

As shown in 24C, there are transformer type inductors $T_{O1}$ and $T_{O2}$. In such transformer type inductors, we increase the symmetry of the LCO tank. For such transformer type inductor, the amplitude and common mode center of $V_{o+}$ and $V_{o-}$ will be almost the same.

FIG. 25 is the self-compensation DFY clock reference circuit which is improved over the temperature compensation capacitor as shown in FIG. 23F. The temperature compensation capacitor as shown in FIG. 23F is no more need in the self-compensation DFY clock reference circuit as shown in FIG. 25.

While the invention has been particularly shown and described with reference to the preferred embodiments thereof, it will be understood by those skilled in the art that various changes in form and details may be made therein without departing from the spirit and scope of the invention.

We claim:

1. A design for yield (DFY) circuit having chip means for crystal-like resonation,
    said chip means containing a LC resonating means and current source means,
    said LC resonating means containing inductor means, capacitor means, varactor means, voltage control means, and inverter means,
    said inductor means, capacitor means and varactor means connecting in parallel to be an LC oscillation tank means, said LC oscillation tank means being connected between an input of said inverter means and an output of said inverter means, said current source means for supplying current to said LC resonating means, and supply nodes of said current source means having therebetween glitch eliminating capacitor means for filtering out glitches generated by said LC resonating means.

2. A DFY circuit according to claim 1 further comprising an oscillation amplitude controlling means, said oscillation amplitude controlling means connecting to said LC oscillation tank means and detecting oscillation amplitude of said LC oscillation tank means, said oscillation amplitude controlling means feedback said oscillation amplitude to said current source means to keep said oscillation amplitude of said LC oscillation tank means to have constant amplitude oscillation.

3. A DFY circuit according to claim 1 further comprising an oscillation common mode voltage controlling means, said oscillation common mode controlling means connecting to said LC oscillation tank means and detecting common mode voltage of said LC oscillation tank means, said oscillation common mode controlling means feedback said common mode voltage to said current source means to keep said common mode voltage of said LC oscillation tank means to have constant common mode voltage.

4. A DFY circuit according to claim 1 further comprising an oscillation amplitude controlling means and common mode voltage controlling means, said oscillation amplitude controlling means connecting to said LC oscillation tank means and detecting oscillation amplitude of said LC oscillation tank means, said oscillation amplitude controlling means feedback said oscillation amplitude to a first said current source means to keep said oscillation amplitude of said LC oscillation tank means to have constant amplitude oscillation;

said oscillation common mode controlling means connecting to said LC oscillation tank means and detecting common mode voltage of said LC oscillation tank means, said oscillation amplitude controlling means feedback said common mode voltage to a second said current source means to keep said common mode voltage of said LC oscillation tank means to be constant common mode voltage.

5. A DFY circuit according to claim 1 further comprising oscillation frequency temperature compensation means, said oscillation frequency temperature compensation means sensing temperature and adjusting capacitance of varactor to fine tune oscillation frequency of said LC oscillation tank means to be constant over variation of temperature.

6. A DFY circuit according to claim 1 of which said inductor means having parametric resistance, said capacitor means and varactor means having a temperature compensating resistance in series connection, said temperature compensating resistance compensating said parametric resistance to keep oscillation frequency of said LC tank being constant over variation of temperature.

7. A design for yield (DFY) circuit having chip means for crystal-like resonation, said chip means containing a LC resonating means and current source means, said LC resonating means containing inductor means, capacitor means, varactor means, voltage control means, inverter means, said inductor means, capacitor means and varactor means connecting in parallel to be an LC oscillation tank means, said LC oscillation tank means being connected between an input of said inverter means and an output of said inverter means, said current source means for supplying current to said inverter means;

said inductor means having parametric resistance, said capacitor means and varactor means having a temperature compensating resistance in series connection, said temperature compensating resistance compensating said parametric resistance to keep oscillation frequency of said LC tank being constant over variation of temperature.

8. A DFY circuit according to claim 7 further comprising an oscillation amplitude controlling means, said oscillation amplitude controlling means connecting to said LC oscillation tank means and detecting oscillation amplitude of said LC oscillation tank means, said oscillation amplitude controlling means feedback said oscillation amplitude to said current source means to keep said oscillation amplitude of said LC oscillation tank means to be constant amplitude.

9. A DFY circuit according to claim 7 further comprising an oscillation common mode voltage controlling means, said oscillation common mode controlling means connecting to said LC oscillation tank means and detecting common mode voltage of said LC oscillation tank means, said oscillation common mode controlling means feedback said common mode voltage to said current source means to keep said common mode voltage of said LC oscillation tank means to be constant common mode voltage.

10. A DFY circuit according to claim 7 further comprising an oscillation amplitude controlling means and common mode voltage controlling means, said oscillation amplitude controlling means connecting to said LC oscillation tank means and detecting oscillation amplitude of said LC oscillation tank means, said oscillation amplitude controlling means feedback said oscillation amplitude to a first said current source means to keep said oscillation amplitude of said LC oscillation tank means to be constant amplitude;

said common mode voltage controlling means connecting to said LC oscillation tank means and detecting common mode voltage of said LC oscillation tank means, said common mode voltage controlling means feedback said common mode voltage to a second said current source means to keep said common mode voltage of said LC oscillation tank means to be constant common mode voltage.

11. A DFY circuit according to claim 1 further comprising voltage source means, said voltage source means being connected between said LC resonating means and current source means, said voltage source means supplying constant voltage to said LC resonating means and isolating said LC resonating means from said LC resonating means generated glitch and push away said glitch to said glitch-eliminating capacitor means.

12. A DFY circuit according to claim 7 further comprising voltage source means, said voltage source means being connected between said LC resonating means and current source means, said voltage source means supplying constant voltage to said LC resonating means and isolating said LC resonating means from LC resonating means generated glitch and push away said glitch.

13. A DFY circuit according to claim 1 further comprising a bandgap voltage generator means, said bandgap voltage generator comprising resistors and diode means, said resistor means having different ratio to reduce offset voltage effect impacting on bandgap voltage.

14. A DFY circuit according to claim 13, said bandgap voltage generator further comprising a power down control means and power-on-reset (POR) means, said power down means supplying power to said POR means, as power up, said POR means injecting current to said bandgap voltage generator to kick said bandgap voltage generator out of dead zone state.

15. A DFY circuit according to claim 1 further comprising reference voltage generator means, said reference voltage generator having bandgap voltage dividing by a resistor to generate reference current;

said reference current flowing through other resistor to generate reference voltage;

said reference voltage having temperature compensation between resistors that said reference voltage being temperature independent.

16. A DFY circuit according to claim 2 of which oscillation amplitude controlling means further comprising a reference voltage generator and a common mode voltage generator, said common mode voltage generator setting common mode voltage and set reference voltage generator generating reference voltage having difference of said reference voltage and said common mode voltage to be constant.

17. A DFY circuit according to claim 1 further comprising oscillation amplitude controlling means and common mode voltage specified means, said inductor of said LC oscillation tank being constituted of two inductors, said oscillation common mode specified means connecting to a node between said two inductors and specified said node voltage to be a specified common voltage, said oscillation amplitude controlling means connecting to said LC oscillation tank means and detecting oscillation amplitude of said LC oscillation tank means, said oscillation amplitude controlling means feedback said oscillation amplitude to said current source means to keep said oscillation amplitude of said LC oscillation tank means to be constant amplitude.

18. A DFY circuit according to claim 7 further comprising oscillation amplitude controlling means and common mode voltage specified means, said inductor of said LC oscillation tank being constituted of two inductors, said oscillation common mode specified means connecting to a node between said two inductors and specified said node voltage to be a specified common voltage, said oscillation amplitude controlling means connecting to said LC oscillation tank means and detecting oscillation amplitude of said LC oscillation tank means, said oscillation amplitude controlling means feedback said oscillation amplitude to said current source means to keep said oscillation amplitude of said LC oscillation tank means to be constant amplitude.

19. A DFY circuit according to claim 18 of said current source having current mirror structure such that said current sources having the same current and said common mode voltage specified means doesn't inject current into said LC oscillation tank to save power.

20. A DFY circuit according to claim 18 of said inductors being transformer type inductors.

* * * * *